(12) United States Patent
Kim et al.

(10) Patent No.: US 12,575,466 B2
(45) Date of Patent: Mar. 10, 2026

(54) SEMICONDUCTOR PACKAGE AND METHOD OF FABRICATING THE SAME

(71) Applicant: Samsung Electronics Co., Ltd., Suwon-si (KR)

(72) Inventors: Daehyun Kim, Suwon-si (KR); Kunsil Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 373 days.

(21) Appl. No.: 18/226,589

(22) Filed: Jul. 26, 2023

(65) Prior Publication Data

US 2024/0222303 A1 Jul. 4, 2024

(30) Foreign Application Priority Data

Jan. 2, 2023 (KR) ........................ 10-2023-0000395

(51) Int. Cl.
*H01L 23/00* (2006.01)
*H01L 23/498* (2006.01)
*H01L 25/18* (2023.01)

(52) U.S. Cl.
CPC ........ *H01L 24/14* (2013.01); *H01L 23/49811* (2013.01); *H01L 24/05* (2013.01); *H01L 24/06* (2013.01); *H01L 24/08* (2013.01); *H01L 24/13* (2013.01); *H01L 24/16* (2013.01); *H01L 24/11* (2013.01); *H01L 24/17* (2013.01); *H01L 24/32* (2013.01); *H01L 24/33* (2013.01); *H01L 24/73* (2013.01); *H01L 24/81* (2013.01); *H01L 25/18* (2013.01); *H01L 2224/05073* (2013.01); *H01L 2224/05144* (2013.01); *H01L 2224/05555* (2013.01); *H01L 2224/0557* (2013.01); *H01L*

*2224/05573* (2013.01); *H01L 2224/05647* (2013.01); *H01L 2224/0603* (2013.01); *H01L 2224/06051* (2013.01);

(Continued)

(58) Field of Classification Search
None
See application file for complete search history.

(56) References Cited

U.S. PATENT DOCUMENTS

| | | | |
|---|---|---|---|
| 8,047,421 B2 | 11/2011 | Sri-Jayantha et al. | |
| 9,935,073 B2 | 4/2018 | Lin et al. | |

(Continued)

FOREIGN PATENT DOCUMENTS

| | | |
|---|---|---|
| JP | 2000124259 A | 4/2000 |
| JP | 2000208665 A | 7/2000 |
| JP | 4562579 B2 | 10/2010 |

*Primary Examiner* — Fernando L Toledo
*Assistant Examiner* — Shawn Shaw Muslim
(74) *Attorney, Agent, or Firm* — Muir Patent Law, PLLC

(57) ABSTRACT

Disclosed are semiconductor packages and their fabrication methods. The semiconductor package comprises a first substrate having first pads on a first surface of the first substrate, a second substrate on the first substrate and having a plurality of second pads on a second surface of the second substrate, and connection terminals between the first substrate and the second substrate and correspondingly coupling the first pad to the second pads. Each of the connection terminals has a first major axis and a first minor axis that are parallel to the first surface of the first substrate and are orthogonal to each other. When viewed in a plan view, the first minor axis of each of the connection terminals is directed toward a center of the first substrate.

20 Claims, 19 Drawing Sheets

(52) U.S. Cl.
CPC ................. *H01L 2224/0613* (2013.01); *H01L 2224/06181* (2013.01); *H01L 2224/08145* (2013.01); *H01L 2224/08225* (2013.01); *H01L 2224/1146* (2013.01); *H01L 2224/11849* (2013.01); *H01L 2224/13007* (2013.01); *H01L 2224/13013* (2013.01); *H01L 2224/13014* (2013.01); *H01L 2224/13111* (2013.01); *H01L 2224/13147* (2013.01); *H01L 2224/1403* (2013.01); *H01L 2224/14051* (2013.01); *H01L 2224/1413* (2013.01); *H01L 2224/16105* (2013.01); *H01L 2224/16145* (2013.01); *H01L 2224/16227* (2013.01); *H01L 2224/17181* (2013.01); *H01L 2224/32145* (2013.01); *H01L 2224/32225* (2013.01); *H01L 2224/33181* (2013.01); *H01L 2224/73204* (2013.01); *H01L 2224/73253* (2013.01); *H01L 2224/81815* (2013.01)

(56) References Cited

U.S. PATENT DOCUMENTS

| | | |
|---|---|---|
| 2011/0235296 A1 | 9/2011 | Shi et al. |
| 2020/0335466 A1 | 10/2020 | Schwartz et al. |
| 2022/0293566 A1* | 9/2022 | Park ........................ H01L 24/83 |

* cited by examiner

SEMICONDUCTOR PACKAGE AND METHOD OF FABRICATING THE SAME

CROSS-REFERENCE TO RELATED APPLICATION

This U.S. nonprovisional application claims priority under 35 U.S.C § 119 to Korean Patent Application No. 10-2023-0000395 filed on Jan. 2, 2023 in the Korean Intellectual Property Office, the disclosure of which is hereby incorporated by reference in its entirety.

BACKGROUND

Aspects of the present inventive concept relate to a semiconductor package and a method of fabricating the same.

Trends in today's electronics industries are to fabricate lightweight, compact, high speed, multi-functionality, and high performance products at reasonable prices. A multi-chip stacked package technique or a system-in-package technique is used to meet these trends. In relation to a multi-chip stacked package or a system-in-package, one semiconductor package may perform functions of a number of unit semiconductor devices. Although the multi-chip stacked package or the system-in-package may be somewhat thicker than a typical single chip package, they have a planar size similar to that of a single chip package and thus are primarily used for high-end, compact, and portable products such as mobile phones, laptop computers, memory cards, or portable camcorders.

A semiconductor device generally uses a metal bump as an electrical connection terminal or a dummy terminal. An increase in integration of chips may induce an increase in amount of solder bumps provided between the chips, and this tendency may cause numerous problems. For example, shape abnormality of the metal bump may lead to a yield drop or process failure, and induce the semiconductor device to have inferior electrical properties. Accordingly, an alignment of metal bumps may be essential in fabricating the semiconductor device.

SUMMARY

Some embodiments of the present inventive concept provide a semiconductor package with improved electrical properties and a method of fabricating the same.

Some embodiments of the present inventive concept provide a semiconductor package with increased operating stability and a method of fabricating the same.

Some embodiments of the present inventive concept provided a method of fabricating a semiconductor package with reduced occurrence of defects and a semiconductor package fabricated by the same.

According to some embodiments of the present inventive concept, a semiconductor package may comprise: a first substrate having a plurality of first pads on a first surface of the first substrate; a second substrate on the first substrate, the second substrate having a plurality of second pads on a second surface of the second substrate, the second pads being positioned corresponding to the first pads; and a plurality of connection terminals between the first substrate and the second substrate, the connection terminals correspondingly coupling the first pad to the second pads. Each of the connection terminals may have a first major axis and a first minor axis that are parallel to the first surface of the first substrate and are orthogonal to each other. When viewed in a plan view, the first minor axis of each of the connection terminals may be directed toward a center of the first substrate.

According to some embodiments of the present inventive concept, a semiconductor package may comprise: a first substrate; a plurality of first pads on a top surface of the first substrate; a first protection layer on the top surface of the first substrate and covering the first pads, wherein the first protection layer has a plurality of first openings that vertically penetrate the first protection layer on the first pads and expose top surfaces of the first pads; and a plurality of first solders correspondingly in the first openings and coupled to the first pads. Each of the first solders may have a first width in a first direction away from a center of the first substrate and a second width in a second direction that rotates about the center of the first substrate. The second width may be about 1.2 times to about 2.5 times the first width.

According to some embodiments of the present inventive concept, a semiconductor package may comprise: a first substrate; a plurality of first pads on a top surface of the first substrate; a second substrate mounted on the first substrate; and a plurality of second pads on a bottom surface of the second substrate and positioned corresponding to the first pads. The first pads may be correspondingly electrically connected to the second pads. Each of the first pads may include: a first minor axis in a first direction away from a central point on a plane on which the top surface of the first substrate is provided; and a first major axis in a second direction that rotates about the central point.

According to some embodiments of the present inventive concept, a method of fabricating a semiconductor package may comprise: providing a first substrate that has first pads on a bottom surface of the first substrate; providing a second substrate that has second pads on a top surface of the second substrate; forming solders on the second pads, wherein each of the solders has a minor axis in a first direction away from a center of the second substrate and a major axis in a second direction that rotates about the center of the second substrate; placing the second substrate on the first substrate to dispose the solders on positions that corresponds to positions of the first pads, wherein, when viewed in a plan view, the second substrate is twist-shifted at an angle ranging from about −10° to about +10° on the first substrate, and wherein each of the first pads overlaps at least a portion of one of the solders; and performing a reflow process to couple the solders to the first pads.

DETAILED DESCRIPTION OF EMBODIMENTS

The following will now describe a semiconductor package according to aspects of the present inventive concept with reference to the accompanying drawings.

Figure 1:
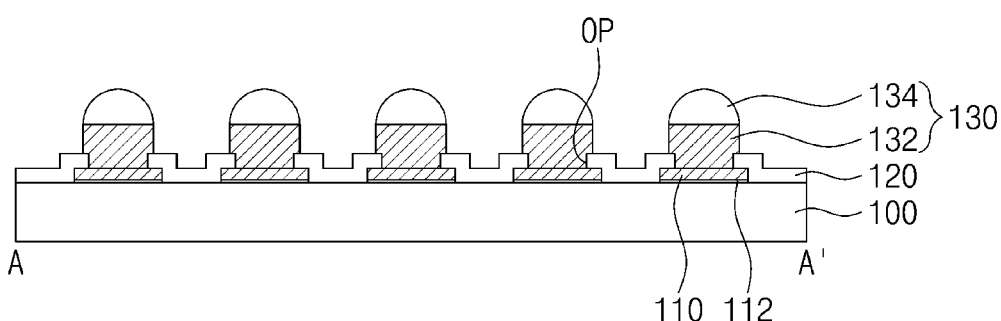
FIGS. 1 and 2 illustrate cross-sectional views showing a semiconductor package according to some embodiments of the present inventive concept.
Figure 2:
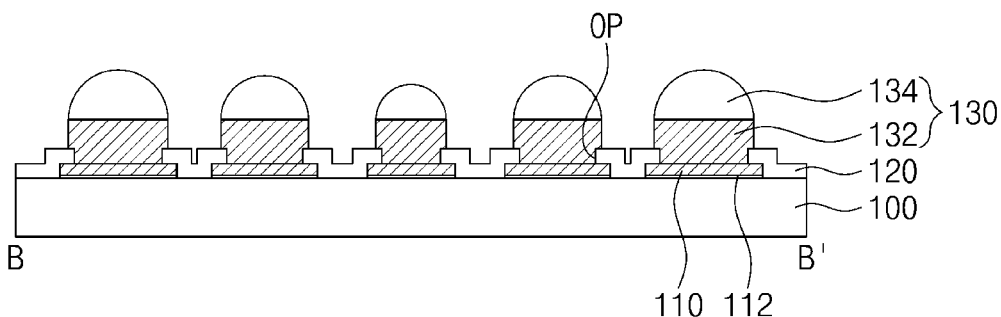
Figure 3:
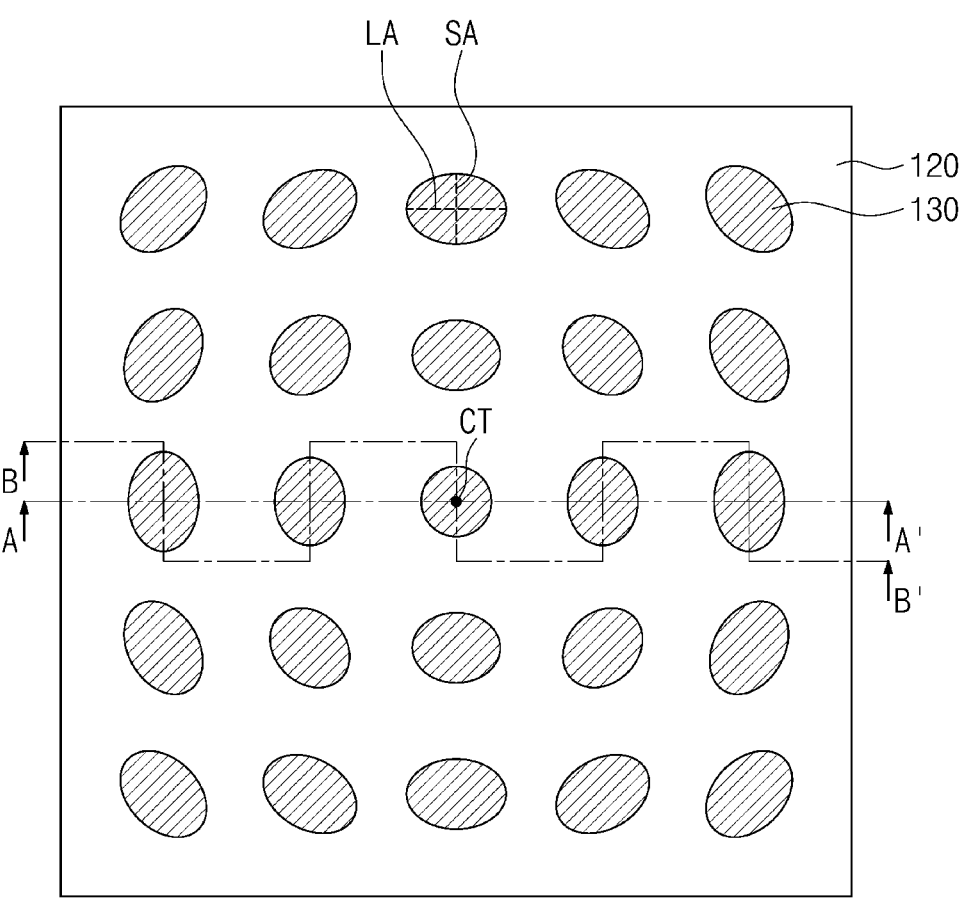
FIG. 3 illustrates a plan view showing a semiconductor package according to some embodiments of the present inventive concept.
Figure 3:
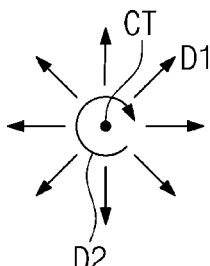
Figure 4:
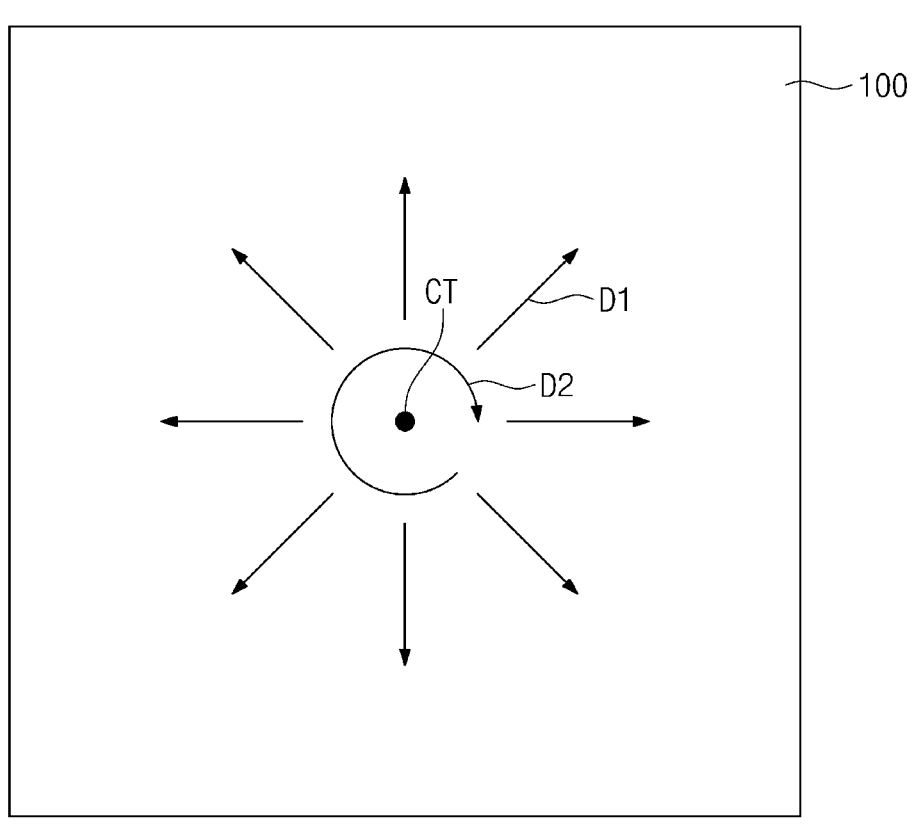
FIG. 4 illustrates a plan view showing a first direction and a second direction on a substrate.
Figure 5:
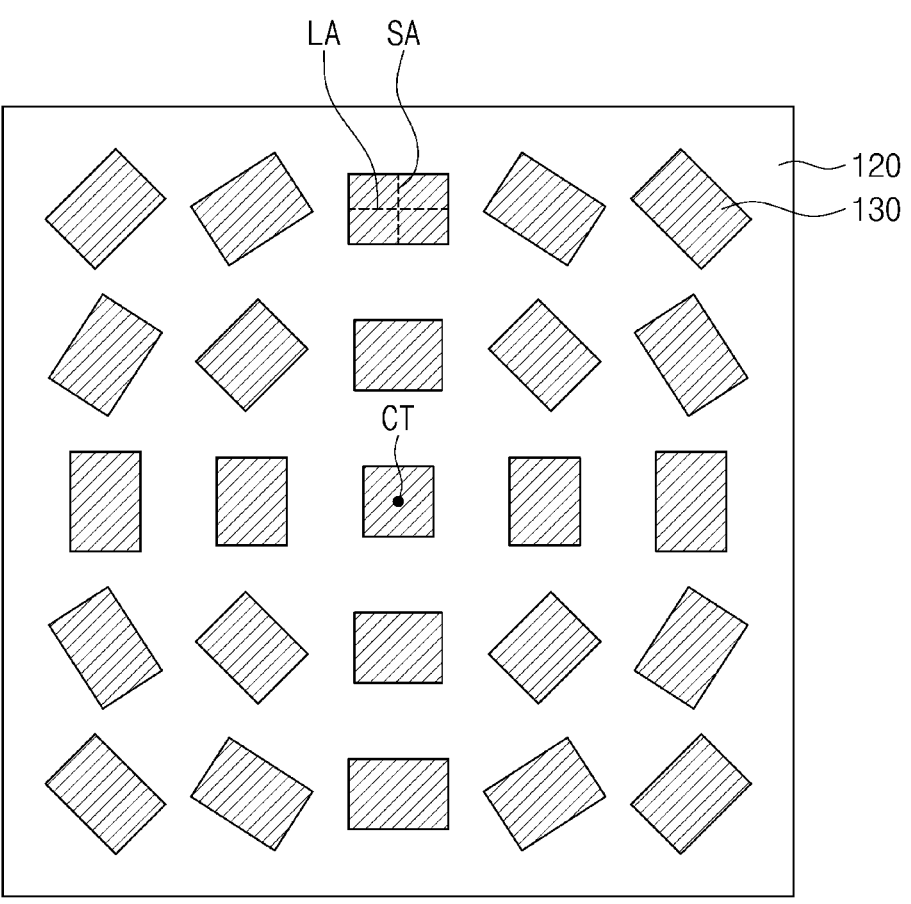
FIGS. 5 and 6 illustrate plan views showing a semiconductor package according to some embodiments of the present inventive concept.
Figure 5:
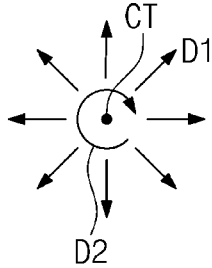
Figure 6:
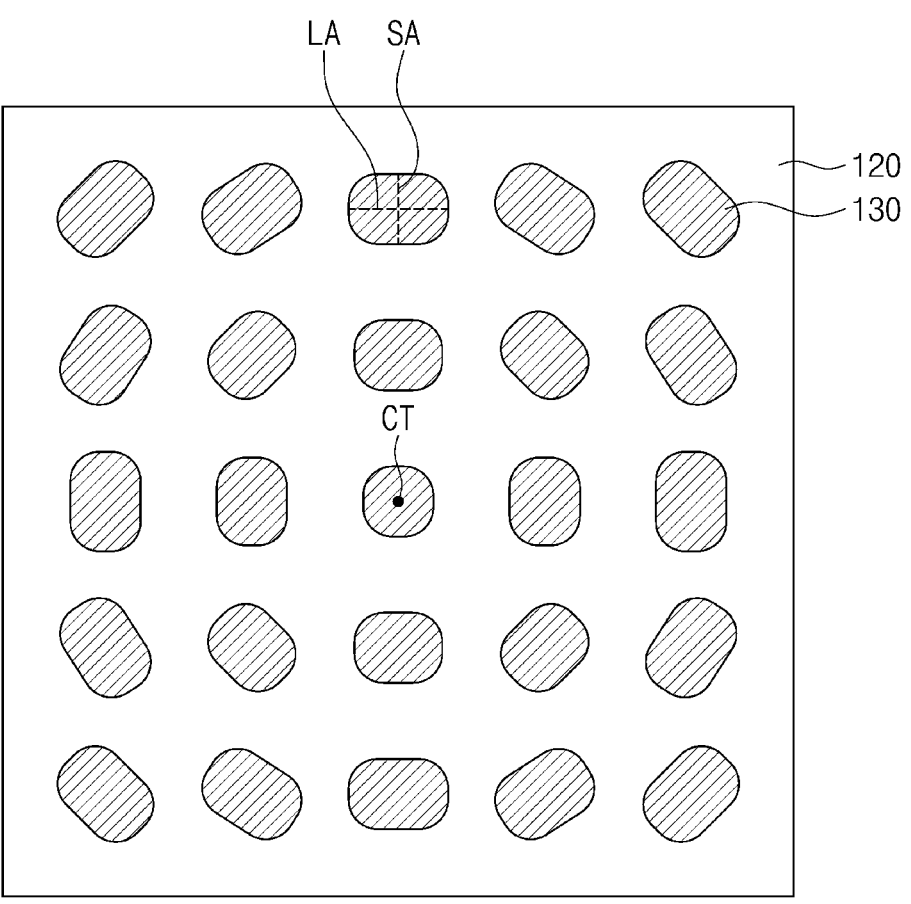
Figure 6:
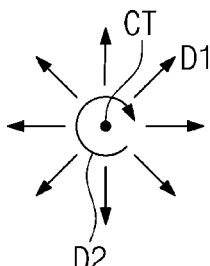

FIGS. 1 and 2 illustrate cross-sectional views showing a semiconductor package according to some embodiments of the present inventive concept. FIG. 3 illustrates a plan view showing a semiconductor package according to some embodiments of the present inventive concept. FIG. 1 corresponds to a cross section taken along line A-A' of FIG. 3. FIG. 2 corresponds to a cross section taken along line B-B' of FIG. 3. FIG. 4 illustrates a plan view showing a first direction and a second direction on a substrate. FIGS. 5 and 6 illustrate plan views showing a semiconductor package according to some embodiments of the present inventive concept.

Referring to FIGS. 1 to 3, a first substrate 100 may be provided. The first substrate 100 may extend in a third direction (e.g., the X-direction) and fourth direction (e.g., the Y-direction), that is perpendicular to the third direction. The first substrate 100 may be a package substrate that mounts a semiconductor package on an external apparatus, a motherboard, or another substrate. Alternatively, the first substrate 100 may be an interposer to redistribute semiconductor chips of a semiconductor package or to connect semiconductor chips to a package substrate of a semiconductor package. For example, the first substrate 100 may be a printed circuit board (PCB) having a signal pattern or a redistribution substrate having a plurality of wiring layers. Alternatively, the first substrate 100 may include a semiconductor substrate. For example, the first substrate 100 may be a semiconductor substrate such as a semiconductor wafer. The first substrate 100 may be a bulk silicon substrate, a silicon-on-insulator (SOI) substrate, a germanium substrate, a germanium-on-insulator (GOI) substrate, a silicon-germanium (SiGe) substrate, or an epitaxial film substrate obtained by performing selective epitaxial growth (SEG). The first substrate 100 may include, for example, at least one selected from silicon (Si), germanium (Ge), silicon germanium (SiGe), gallium arsenic (GaAs), indium gallium arsenic (InGaAs), aluminum gallium arsenic (AlGaAs), and a mixture thereof. When the first substrate 100 is a semiconductor substrate, the first substrate 100 may include an integrated circuit therein. The first substrate 100 may include a semiconductor chip including an electronic element such as a transistor. For example, the first substrate 100 may be a wafer-level die formed of a semiconductor such as silicon (Si). Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The first substrate 100 may have first substrate pads 110 provided on a top surface of the first substrate 100. The first substrate pads 110 may be disposed spaced apart from each other. The first substrate pads 110 may have heights that are substantially the same as each other. For example, uniform distances may be provided between the top surface of the first substrate 100 and top surfaces of the first substrate pads 110. The heights of the first substrate pads 110 may extend in a fifth direction (e.g., vertical direction, the Z-direction) that is perpendicular to the third direction and the fourth direction. The first substrate pads 110 may have the same width in a horizontal direction (e.g., in the third direction and/or the fourth direction) as each other. Aspects of the present inventive concept, however, are not limited thereto, and the first substrate pads 110 may have different widths from each other. The first substrate pads 110 may be electrically connected to a circuit or wiring line provided in the first substrate 100. The first substrate pads 110 may each have a circular planar shape, an oval planar shape, or a polygonal planar shape. The planar shapes of the first substrate pads 110 may be constant irrespective of position on the first substrate 100. Alternatively, the planar shapes of the first substrate pads 110 may be changed depending on position on the first substrate 100. This will be further discussed in detail below with planar shapes of first bump structures 130. The first substrate pads 110 may include metal, such as copper (Cu).

Seed layers may be provided between the first substrate pads 110 and the first substrate 100. For example, first seed layers 112 may be provided between the first substrate 100 and the first substrate pads 110. Each of the first seed layers 112 may be provided on a bottom surface of one of the first substrate pads 110. FIGS. 1 and 2 depict that the first seed layers 112 cover only the bottom surfaces of the first substrate pads 110, but aspects of the present inventive concept are not limited thereto. The first seed layers 112 may extend from the bottom surfaces of the first substrate pads 110 onto lateral surfaces of the first substrate pads 110. The following description will focus on the embodiment of FIGS. 1 and 2. The first seed layers 112 may include metal, such as gold (Au).

A first protection layer 120 may be provided on the first substrate 100. The first protection layer 120 may cover the top surface of the first substrate 100. On the top surface of the first substrate 100, the first protection layer 120 may cover the first substrate pads 110. The first protection layer 120 may conformally cover the first substrate pads 110 and the top surface of the first substrate 100. The first protection layer 120 may have a uniform thickness. The first protection layer 120 may include a photo-imageable material. For example, the first protection layer 120 may include a photo-imageable dielectric (PID). In detail, the photo-imageable dielectric may include at least one selected from photosensitive polyimide (PI), polybenzoxazole (PBO), phenolic polymers, and benzocyclobutene polymers.

The first protection layer 120 may have openings OP that vertically (e.g., in the fifth direction) penetrate the first protection layer 120. For example, the openings OP may be positioned on the first substrate pads 110. The openings OP may completely penetrate the first protection layer 120 to expose the first substrate pads 110. For example, each of the openings OP may be positioned on one of the first substrate pads 110, and may partially expose the top surfaces of the first substrate pads 110. The openings OP may have planar shapes and areas less than those of the first substrate pads 110. When viewed in a cross-sectional view, as shown in FIGS. 1 and 2, each of the openings OP may be positioned within one of the first substrate pads 110. For example, the openings OP may expose central portions of the first substrate pads 110, and the first protection layer 120 may cover an edge of each of the first substrate pads 110. The openings OP may each have a circular planar shape, an oval planar shape, or a polygonal planar shape. The planar shapes of the openings OP may be constant irrespective of position on the first substrate 100. Alternatively, the planar shapes of the openings OP may be changed depending on position on the first substrate 100. This will be further discussed in detail below with planar shapes of first bump structures 130.

The first protection layer 120 may be provided thereon with first bump structures 130. For example, each of the first bump structures 130 may be positioned on one of the first substrate pads 110. The first bump structures 130 may penetrate the first protection layer 120 to be connected to the first substrate pads 110. For example, the first bump structures 130 may be coupled to the top surfaces of the first substrate pads 110 exposed by the openings OP. The first bump structures 130 may correspond to connection terminals that mount the first substrate 100 on an external apparatus, a motherboard, or another substrate. The first bump structures 130 may have widths greater than those of the openings OP. When viewed in a plan view, the openings OP may be positioned within the first bump structures 130. The first bump structures 130 may be exposed on the first protection layer 120. Therefore, the first bump structures 130 may completely fill the openings OP, and portions of the first bump structures 130 may extend onto the first protection layer 120. For example, the first bump structures 130 may completely cover the openings OP, and the first bump structures 130 may prevent the openings OP from being visible from the outside (e.g., a plan view). The first bump structures 130 may have planar shapes that are changed depending on position on the first substrate 100. As shown in FIG. 3, the first bump structures 130 may each have a planar shape whose width in one direction is greater than that in another direction. For example, when viewed in a plan view, each of the first bump structures 130 may have a major axis LA and a minor axis SA. The major axis LA and the minor axis SA may be parallel to the top surface of the first substrate 100. When viewed in a plan view, the minor axis SA of each of the first bump structures 130 may be directed toward a center CT of the first substrate 100. For convenience of description, as shown in FIG. 4, a first direction D1 is defined to indicate a radial direction that is away from the center CT of the first substrate 100, and a second direction D2 defined to indicate a direction that rotates about the center CT of the first substrate 100. For example, at each position or point along the second direction D2, the second direction D2 may be perpendicular to the first direction D1. The minor axis SA of each of the first bump structures 130 may be directed in the first direction D1. The major axis LA of each of the first bump structures 130 may extend tangentially to a circle having a center disposed at center CT of the first substrate 100. For example, the major axes LA of the first bump structures 130 may be arranged along concentric circles centered around the center CT of the first substrate 100. A ratio of the major axis LA to the minor axis SA of each of the first bump structures 130 may have a value selected from a range from about 1.2:1 to about 2.5:1. The minor axes SA of the first bump structures 130 may have uniform lengths. For example, the minor axes SA of the first bump structures 130 may have the same length. The major axes LA of the first bump structures 130 may have lengths that increase with increasing distance from the center CT of the first substrate 100. The first bump structures 130 may each have an oval planar shape having the major axis LA and the minor axis SA. According to some embodiments, as shown in FIG. 5, the first bump structures 130 may each have a rectangular or polygonal planar shape having a major axis LA and a minor axis SA. According to some embodiments, as shown in FIG. 6, the first bump structures 130 may each have a rectangular or polygonal planar shape with rounded corners. The following description will focus on the embodiment of FIG. 3. The first bump structure 130 positioned on the center CT of the first substrate 100 may have the same length at the major axis LA and the minor axis SA. For example, the first bump structure 130 may have a circular planar shape.

According to some embodiments of the present inventive concept, the first bump structures 130 may have major axes LA that extend along (e.g., tangential to) the second direction D2 that rotates about the center CT of the first substrate 100. Therefore, when the first bump structures 130 are used to electrically connect the first substrate 100 to a certain device, such as an external apparatus, a motherboard, or another substrate, the first bump structures 130 may be stably connected to the certain device even when the first substrate 100 is twist-shifted (or rotationally shifted) from the certain device. Accordingly, it may be possible to provide a semiconductor package with improved electrical connection properties and increased structural stability. This will be further discussed in detail below.

An interval between neighboring first bump structures 130 may be greater than about 0.5 times the major axis LA thereof. For example, the interval between the first bump structures 130 may have a value selected from a range from about 2 micrometers to about 8 micrometers.

The openings OP of the first protection layer 120 may have planar shapes that correspond to those of the first bump structures 130. The planar shapes of the openings OP may be changed depending on position on the first substrate 100. The openings OP may each have a circular planar shape or an oval planar shape. When viewed in a plan view, each of the openings OP may have a major axis and a minor axis. The major axis and the minor axis of each of the openings OP may be parallel to the major axis LA and the minor axis SA of the first bump structure 130 that overlies the opening OP. For example, the planar shape of each of the openings OP may correspond to that of the first bump structure 130 that overlies the opening OP. For example, the openings OP may each have an oval planar shape having the major axis and the minor axis. According to some embodiments, the openings OP may each have a rectangular or polygonal planar shape having a major axis and a minor axis. When viewed in a plan view, the minor axis of each of the openings OP may be directed in the first direction D1, and the major axis of each of the openings OP may be directed in the second direction D2. For example, the major axes of the openings OP may be arranged along concentric circles centered around the center CT of the first substrate 100. Aspects of the present inventive concept, however, are not limited thereto. The planar shapes of the openings OP in the first protection layer 120 may be variously changed if necessary.

The first substrate pads 110 may have planar shapes that correspond to those of the first bump structures 130. The planar shapes of the first substrate pads 110 may be changed depending on position on the first substrate 100. The first substrate pads 110 may have circular or oval planar shapes. When viewed in a plan view, each of the first substrate pads 110 may have a major axis and a minor axis. The major axis and the minor axis of each of the first substrate pads 110 may be parallel to the major axis LA and the minor axis SA of the first bump structure 130 that overlies the first substrate pads 110. The planar shape of each of the first substrate pads 110 may correspond to that of the first bump structure 130 that overlies the first substrate pad 110. For example, the first substrate pads 110 may each have an oval planar shape having the major axis and the minor axis. According to some embodiments, the first substrate pads 110 may each have a rectangular or polygonal planar shape having a major axis and a minor axis. When viewed in a plan view, the minor axis of each of the first substrate pads 110 may be directed in the first direction D1, and the major axis of each of the first substrate pads 110 may be directed in the second direction D2. For example, the major axes of the first substrate pads 110 may be arranged along (e.g., tangential to) concentric circles centered around the center CT of the first substrate 100. Aspects of the present inventive concept, however, are not limited thereto. The planar shapes of the first substrate pads 110 may be variously changed if necessary.

Each of the first bump structures 130 may include a first conductive post 132 and a first solder bump 134 provided on the first conductive post 132.

The first conductive post 132 may have a pillar shape. The first conductive post 132 may have a uniform width. The width of the first conductive post 132 may correspond to that of the first bump structure 130. For example, the first conductive post 132 may have a planar shape that corresponds to the aforementioned planar shape of the first bump structure 130. The planar shape of the first conductive post 132 may be an oval shape having a minor axis directed in the first direction D1 and a major axis directed in the second direction D2. On the first substrate pads 110, the first conductive posts 132 may contact the first substrate pads 110, fill the openings OP, and protrude beyond the first protection layer 120. For example, as shown in FIGS. 1 and 2, on the first substrate pads 110, the first protection layer 120 may have a shape that is inserted into lower portions of the first conductive posts 132. The first conductive post 132 may include a metallic material, such as copper (Cu).

The first solder bump 134 may be disposed on a top surface of the first conductive post 132. The first solder bump 134 may have a hemispheric shape that covers the top surface of the first conductive post 132. Aspects of the present inventive concept, however, are not limited thereto. A maximum width of the first solder bump 134 may be the same as or similar to the width of the first conductive post 132. The first solder bump 134 may include a solder material or alloy including tin (Sn).

In the embodiments that follow, a detailed description of technical features repetitive to those discussed above with reference to FIGS. 1 to 6 will be omitted, and a difference thereof will be discussed in detail. The same reference numerals may be allocated to the same components as those of the semiconductor package discussed above according to some embodiments of the present inventive concept.

Figure 7:
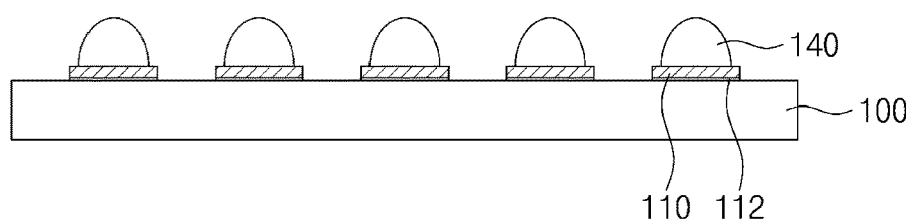
FIG. 7 illustrates a cross-sectional view showing a semiconductor package according to some embodiments of the present inventive concept.
Figure 8:
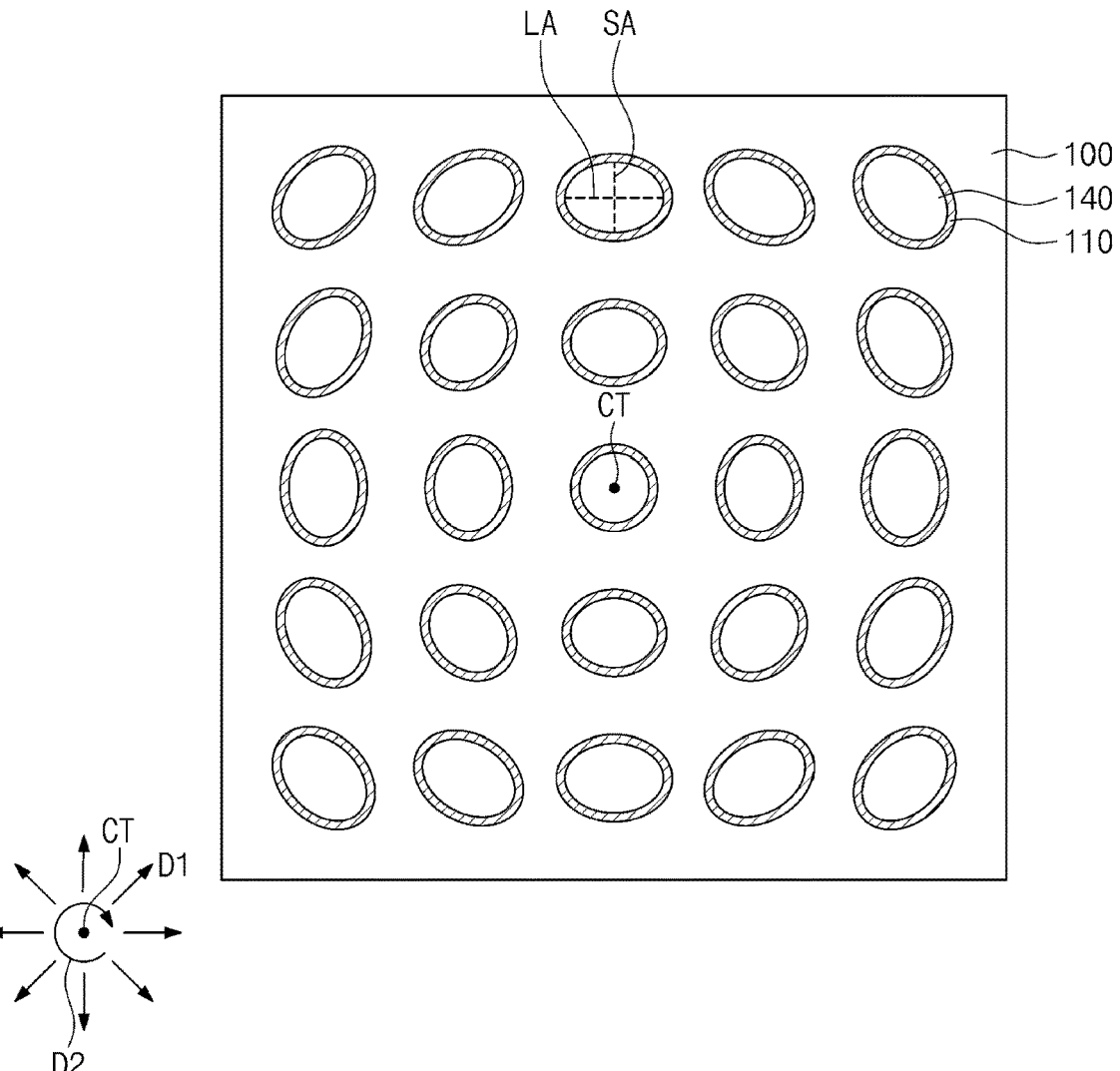
FIG. 8 illustrates a plan view showing a semiconductor package according to some embodiments of the present inventive concept.

FIG. 7 illustrates a cross-sectional view showing a semiconductor package according to some embodiments of the present inventive concept. FIG. 8 illustrates a plan view showing a semiconductor package according to some embodiments of the present inventive concept.

Differently from the embodiments of FIGS. 1 to 6, bump structures may not be adopted as connection terminals of a semiconductor package.

Referring to FIGS. 7 and 8, there may be provided a first substrate 100 and first substrate pads 110 on the first substrate 100. As shown in FIG. 8, the first substrate pads 110 may have planar shapes that are changed depending on position on the first substrate 100. The first substrate pads 110 may have circular or oval planar shapes. When viewed in a plan view, each of the first substrate pads 110 may have a major axis and a minor axis. The planar shapes of the first substrate pads 110 may correspond to those of solders 140 that overlie the first substrate pads 110. For example, the first substrate pads 110 may each have an oval planar shape having the major axis and the minor axis. According to some embodiments, the first substrate pads 110 may each have a rectangular or polygonal planar shape having a major axis and a minor axis. When viewed in a plan view, the minor axis of each of the first substrate pads 110 may be directed in the first direction D1. The major axis of each of the first substrate pads 110 may extend tangentially to a circle having a center disposed at center CT of the first substrate 100. For example, the major axes of the first substrate pads 110 may be arranged along concentric circles centered around a center CT of the first substrate 100. As discussed above, first seed layers 112 may be provided between the first substrate 100 and the first substrate pads 110.

The solders 140 may be provided on the first substrate pads 110. For example, each of the solders 140 may be positioned on one of the first substrate pads 110. The solders 140 may be coupled to top surfaces of the first substrate pads 110. The solders 140 may correspond to connection terminals that mount the first substrate 100 on an external apparatus, a motherboard, or another substrate. The solders 140 may each have a width less than that of the first substrate pad 110 that underlies the solder 140. When viewed in a plan view, the solders 140 may be positioned within the first substrate pads 110. The planar shapes of the solders 140 may be changed depending on position on the first substrate 100. As shown in FIG. 8, the solders 140 may each have a planar shape whose width in one direction is greater than that in another direction. For example, when viewed in a plan view, each of the solders 140 may have a major axis LA and a minor axis SA. The major axis LA and the minor axis SA may be parallel to a top surface of the first substrate 100. When viewed in a plan view, the minor axis SA of each of the solders 140 may be directed toward the center CT of the first substrate 100. The minor axis SA of each of the solders 140 may be directed in the first direction D1. The major axis LA of each of the solders 140 may extend tangentially to a circle having a center disposed at center CT of the first substrate 100. For example, the major axes LA of the solders 140 may be arranged along concentric circles centered around the center CT of the first substrate 100. A ratio of the major axis LA to the minor axis SA of each of the solders 140 may have a value selected from a range from about 1.2:1 to about 2.5:1. The minor axes SA of the solders 140 may have uniform lengths. The major axes LA of the solders 140 may have lengths that increase with increasing distance from the center CT of the first substrate 100. The solders 140 may each have an oval or rectangular planar shape having the major axis LA and the minor axis SA. The solder 140 positioned on the center CT of the first substrate 100 may have a circular planar shape. The solders 140 may include solder balls or solder bumps.

Figures 9, 10:
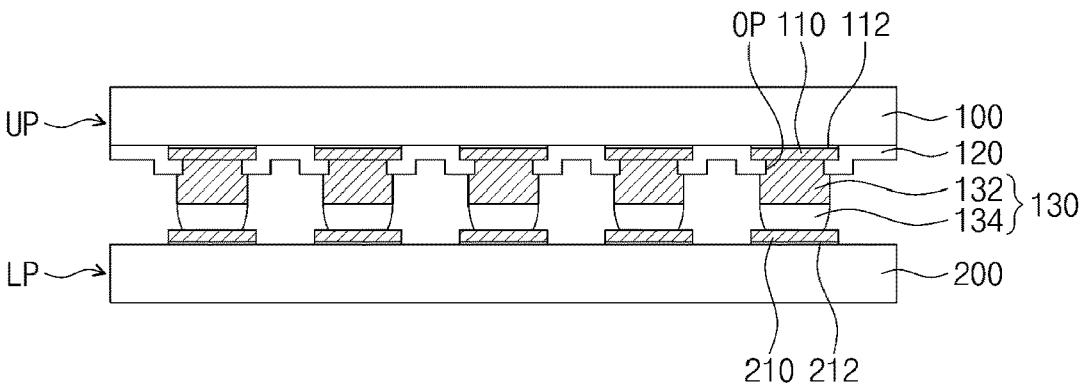
FIG. 9 illustrates a cross-sectional view showing a semiconductor package according to some embodiments of the present inventive concept.
FIG. 10 illustrates a plan view showing a semiconductor package according to some embodiments of the present inventive concept.

FIG. 9 illustrates a cross-sectional view showing a semiconductor package according to some embodiments of the present inventive concept. FIG. 10 illustrates a plan view showing a semiconductor package according to some embodiments of the present inventive concept.

Referring to FIGS. 9 and 10, a lower package LP may be provided. The lower package LP may include a second substrate 200 and second substrate pads 210 on the second substrate 200.

The second substrate 200 may be a package substrate that mounts a semiconductor package on an external apparatus, a motherboard, or another substrate. Alternatively, the second substrate 200 may be an interposer to redistribute semiconductor chips of a semiconductor package or to connect semiconductor chips to a package substrate of a semiconductor package. For example, the second substrate 200 may be a printed circuit board (PCB) having a signal pattern or a redistribution substrate having a plurality of wiring layers. Alternatively, the second substrate 200 may include a semiconductor substrate. For example, the second substrate 200 may be a semiconductor substrate such as a semiconductor wafer. The second substrate 200 may be a bulk silicon substrate, a silicon-on-insulator (SOI) substrate, a germanium substrate, a germanium-on-insulator (GOI) substrate, a silicon-germanium (SiGe) substrate, or an epitaxial film substrate obtained by performing selective epitaxial growth (SEG). The second substrate 200 may include, for example, at least one selected from silicon (Si), germanium (Ge), silicon germanium (SiGe), gallium arsenic (GaAs), indium gallium arsenic (InGaAs), aluminum gallium arsenic (AlGaAs), and a mixture thereof. When the second substrate 200 is a semiconductor substrate, the second substrate 200 may include an integrated circuit therein. The second substrate 200 may include a semiconductor chip including an electronic element such as a transistor. For example, the second substrate 200 may be a wafer-level die formed of a semiconductor such as silicon (Si).

The second substrate 200 may have second substrate pads 210 provided on a top surface of the second substrate 200. The second substrate pads 210 may be disposed spaced apart from each other. The second substrate pads 210 may have heights in the vertical direction (e.g., fifth direction, Z-direction) that are substantially the same as each other. For example, uniform distances may be provided between the top surface of the second substrate 200 and top surfaces of the second substrate pads 210. The second substrate pads 210 may have the same width in a horizontal direction (e.g., in the third direction and/or the fourth direction) as each other. Aspects of the present inventive concept, however, are not limited thereto, and the second substrate pads 210 may have different widths from each other. The second substrate pads 210 may be electrically connected to a circuit or wiring line provided in the second substrate 200. The second substrate pads 210 may each have a circular planar shape, an oval planar shape, or a polygonal planar shape. The planar shapes of the second substrate pads 210 may be constant irrespective of position on the second substrate 200. The second substrate pads 210 may include metal, such as copper (Cu).

Seed layers may be provided between the second substrate pads 210 and the second substrate 200. For example, second seed layers 212 may be provided between the second substrate 200 and the second substrate pads 210. Each of the second seed layers 212 may be provided on a bottom surface of one of the second substrate pads 210. FIGS. 9 and 10 depict that the second seed layers 212 cover only the bottom surfaces of the second substrate pads 210, but aspects of the present inventive concept are not limited thereto. The second seed layers 212 may extend from the bottom surfaces of the second substrate pads 210 onto lateral surfaces of the second substrate pads 210. The following description will focus on the embodiment of FIGS. 9 and 10. The second seed layers 212 may include metal, such as gold (Au).

An upper package UP may be provided on the lower package LP. The upper package UP may be the semiconductor package discussed with reference to FIGS. 1 to 6. For example, the upper package UP may include a first substrate 100, first substrate pads 110 on the first substrate 100, a first protection layer 120 that covers the first substrate pads 110 on the first substrate 100, and first bump structures 130 on the first protection layer 120 and coupled through openings OP to the first substrate pads 110. A minor axis of each of the first bump structures 130 may be directed in the first direction D1, and a major axis of each of the first bump structures 130 may be directed in the second direction D2. For example, the first bump structures 130 may each have an oval or rectangular planar shape having a major axis and a minor axis.

The upper package UP may be provided on the lower package LP. The first bump structures 130 may be directed toward the lower package LP. For example, the lower package LP and the upper package UP may be aligned to allow the second substrate pads 210 of the lower package LP to face the first bump structures 130 of the upper package UP. The upper package UP may be mounted on the lower package LP. For example, the first solder bumps 134 of the first bump structures 130 may be coupled to the second substrate pads 210.

When the upper package UP is mounted on the lower package LP, the lower package LP and the upper package UP may not be completely aligned due to process distribution or mechanical errors of process equipment. For example, the second substrate 200 may be disposed twist-shifted on the first substrate 100. A twist-shift angle $\theta$ between the second substrate 200 and the first substrate 100 may have a value selected from a range from about $-10°$ to about $+10°$. In this description, the twist-shift angle $\theta$ between the second substrate 200 and the first substrate 100 may indicate the degree of twist between the first substrate 100 and the second substrate 200 in a state where the center CT and corners of the first substrate 100 are aligned with a center and corners of the second substrate 200. When the center CT and the corners of the first substrate 100 are aligned with the center and the corners of the second substrate 200, central points of the first bump structures 130 on the first substrate 100 may be vertically aligned with central points of the second substrate pads 210 on the second substrate 200. In this case (as illustrated in FIG. 10), the first substrate pads 110 and the second substrate pads 210 may not be completely vertically aligned due to the twist-shift between the first substrate 100 and the second substrate 200. For example, among the first substrate pads 110 and the second substrate pads 210, a pair of first and second substrate pads 110 and 210 may be horizontally shifted from each other when viewed in a plan view. In this case, central points of the first substrate pads 110 may be horizontally spaced apart from central points of the second substrate pads 210. Each of the first substrate pads 110 may vertically overlap at least a portion of one of the second substrate pads 210.

According to some embodiments of the present inventive concept, the first bump structures 130 may have major axes that extend along (e.g., tangential to) the second direction D2 that rotates about the center CT of the first substrate 100. For example, the first bump structures 130 may each have a plane shape elongated in the second direction D2. Therefore, even when the lower package LP and the upper package UP are twist-shifted from each other, the second substrate pads 210 may vertically overlap at least portions of the first substrate pads 110, and the first substrate pads 110 and the second substrate pads 210 may be prevented from contact failure caused by misalignment between the lower package LP and the upper package UP. Accordingly, a semiconductor package may increase in electrical connection properties, structural stability, and operating stability.

Figures 11, 12:
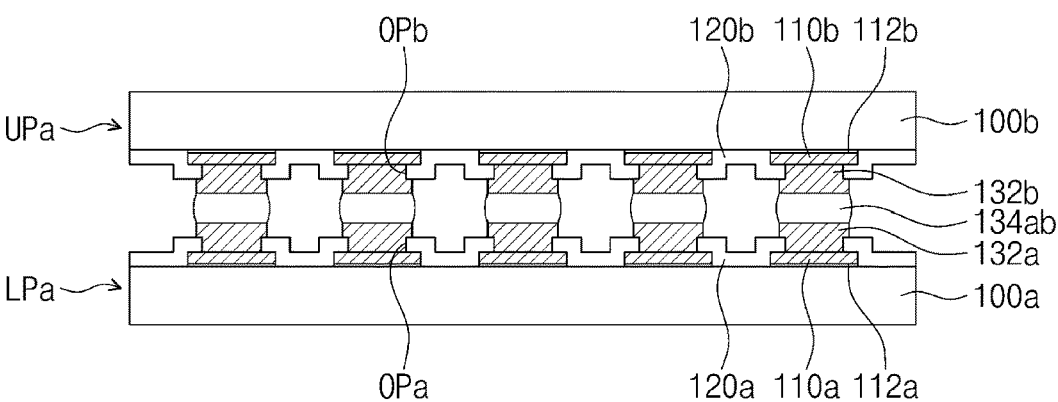
FIG. 11 illustrates a cross-sectional view showing a semiconductor package according to some embodiments of the present inventive concept.
FIG. 12 illustrates a plan view showing a semiconductor package according to some embodiments of the present inventive concept.

FIG. 11 illustrates a cross-sectional view showing a semiconductor package according to some embodiments of the present inventive concept. FIG. 12 illustrates a plan view showing a semiconductor package according to some embodiments of the present inventive concept.

Referring to FIGS. 11 and 12, a lower package LPa may be provided. The lower package LPa may be the same as or similar to the semiconductor package discussed with reference to FIGS. 1 to 6. For example, the lower package LPa may include a third substrate 100*a*, third substrate pads 110*a* on the third substrate 100*a*, third seed layers 112*a* below the third substrate pads 110*a*, a third protection layer 120*a* that covers the third substrate pads 110*a* on the third substrate 100*a*, and third bump structures on the third protection layer 120*a* and coupled through openings OPa to the third substrate pads 110*a*. The third bump structures may each include a third conductive post 132*a* and a third solder bump on the third conductive post 132*a*. A minor axis of each of the third conductive posts 132*a* may be directed in the first direction D1, and a major axis of each of the third conductive posts 132*a* may be directed in the second direction D2. For example, the third conductive posts 132*a* may each have an oval or rectangular planar shape having a major axis and a minor axis.

An upper package UPa may be provided on the lower package LPa. The upper package UPa may be the same as or similar to the semiconductor package discussed with reference to FIGS. 1 to 6. For example, the upper package UPa may include a fourth substrate 100*b*, fourth substrate pads 110*b* on the fourth substrate 100*b*, fourth seed layers 112*b* below the fourth substrate pads 110*b*, a fourth protection layer 120*b* that covers the fourth substrate pads 110*b* on the fourth substrate 100*b*, and fourth bump structures on the fourth protection layer 120*b* and coupled through openings OPb to the fourth substrate pads 110*b*. The fourth bump structures may each include a fourth conductive post 132*b* and a fourth solder bump on the fourth conductive post 132*b*. A minor axis of each of the fourth conductive posts 132*b* may be directed in the first direction D1, and a major axis of each of the fourth conductive posts 132*b* may be directed in the second direction D2. For example, the fourth conductive posts 132*b* may each have an oval or rectangular planar shape having a major axis and a minor axis.

An upper package UPa may be disposed on the lower package LPa. The fourth bump structures may be directed toward the lower package LPa. For example, the lower package LPa and the upper package UPa may be aligned to allow the third conductive posts 132*a* of the lower package LPa to face the fourth conductive posts 132*b* of the upper package UPa. The upper package UPa may be mounted on the lower package LPa. For example, the third solder bump of the third bump structure and the fourth solder bump of the fourth bump structure may be combined to form one bump structure 134*ab*.

When the upper package UPa is mounted on the lower package LPa, the lower package LPa and the upper package UPa may not be completely aligned due to process distribution or mechanical errors of process equipment. For example, the fourth substrate 100*b* may be disposed twist-shifted on the third substrate 100*a*. The third substrate pads 110*a* and the fourth substrate pads 110*b* may not be completely vertically aligned due to the twist-shift between the third substrate 100*a* and the fourth substrate 100*b*. For example, among the third substrate pads 110*a* and the fourth substrate pads 110*b*, a pair of third and fourth substrate pads 110*a* and 110*b* may be horizontally shifted from each other when viewed in a plan view. Each of the fourth substrate pads 110*b* may vertically overlap at least a portion of one of the third substrate pads 110*a*.

According to some embodiments of the present inventive concept, the third conductive posts 132*a* may each have a major axis that extends along (e.g., tangential to) the second direction D2 that rotates about a center CT of the third substrate 100*a*, and the fourth conductive posts 132*b* may each have a major axis that extends along (e.g., tangential to) the second direction D2 that rotates about a center CT of the fourth substrate 100*b*. Therefore, even when the lower package LPa and the upper package UPa are twist-shifted from each other, the third substrate pads 110*a* may vertically overlap at least portions of the fourth substrate pads 110*b*, and even when the third substrate 100*a* and the fourth substrate 100*b* are considerably distorted, the third conductive posts 132*a* may be easily connected to the fourth conductive posts 132*b*.

Figure 13:
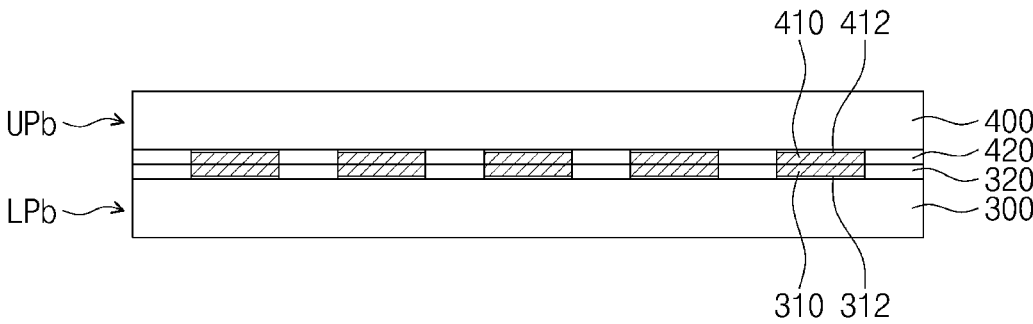
FIGS. 13 and 14 illustrate cross-sectional views showing a semiconductor package according to some embodiments of the present inventive concept.

FIG. 13 illustrates a cross-sectional view showing a semiconductor package according to some embodiments of the present inventive concept.

Referring to FIG. 13, neither an upper package UPb nor a lower package LPb may include bump structures.

The lower package LPb may include a fifth substrate 300, fifth substrate pads 310 on the fifth substrate 300, fifth seed layers 312 below the fifth substrate pads 310, and a fifth protection layer 320 that surrounds the fifth substrate pads 310 on the fifth substrate 300. A top surface of the fifth protection layer 320 may be substantially coplanar with those of the fifth substrate pads 310. A minor axis of each of the fifth substrate pads 310 may be directed toward a center of the fifth substrate 300. A major axis of each of the fifth substrate pads 310 may extend tangentially to a circle having a center disposed at the center of the fifth substrate 300. For example, the fifth substrate pads 310 may each have an oval or rectangular planar shape having a major axis and a minor axis.

The upper package UPb may include a sixth substrate 400, sixth substrate pads 410 on the sixth substrate 400, sixth seed layers 412 below the sixth substrate pads 410, and a sixth protection layer 420 that surrounds the sixth substrate pads 410 on the sixth substrate 400. A top surface of the sixth protection layer 420 may be substantially coplanar with those of the sixth substrate pads 410. A minor axis of each of the sixth substrate pads 410 may be directed toward a center of the sixth substrate 400. A major axis of each of the sixth substrate pads 410 may extend tangentially to a circle having a center disposed at the center of the sixth substrate 400. For example, the sixth substrate pads 410 may each have an oval or rectangular planar shape having a major axis and a minor axis.

The upper package UPb may be disposed on the lower package LPb. The lower package LPb and the upper package UPb may be aligned to allow the fifth substrate pads 310 of the lower package LPb to face the sixth substrate pads 410 of the upper package UPb. The upper package UPb may be mounted on the lower package LPb. For example, the lower package LPb and the upper package UPb may be in contact with each other, and on a boundary between the lower package LPb and the upper package UPb, the fifth substrate pads 310 may be bonded to the sixth substrate pads 410. In some embodiments, the fifth substrate pad 310 and the sixth substrate pad 410 may be combined into a single unitary piece, but aspects of the present inventive concept are not limited thereto. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

According to some embodiments of the present inventive concept, the fifth substrate pads 310 may have major axes that extend along (e.g., tangential to) a direction that rotates about the center of the fifth substrate 300, and the sixth substrate pads 410 may have major axes that extend along (e.g., tangential to) a direction that rotates about the center of the sixth substrate 400. Therefore, even when the lower package LPb and the upper package UPb are twist-shifted from each other, the fifth substrate pads 310 may vertically overlap at least portions of the sixth substrate pads 410 and may be easily connected to the sixth substrate pads 410.

Figure 14:
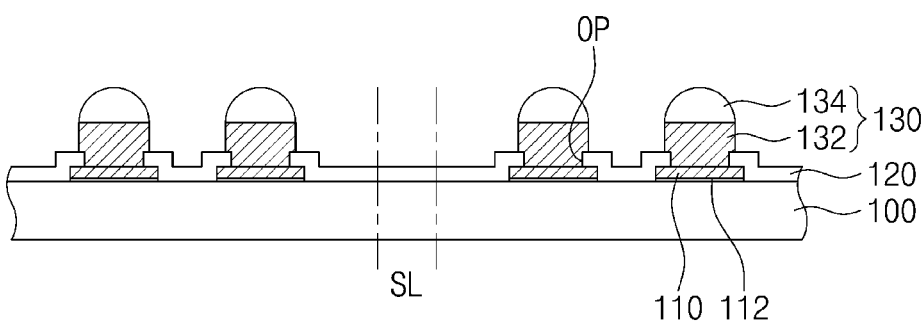
Figure 15:
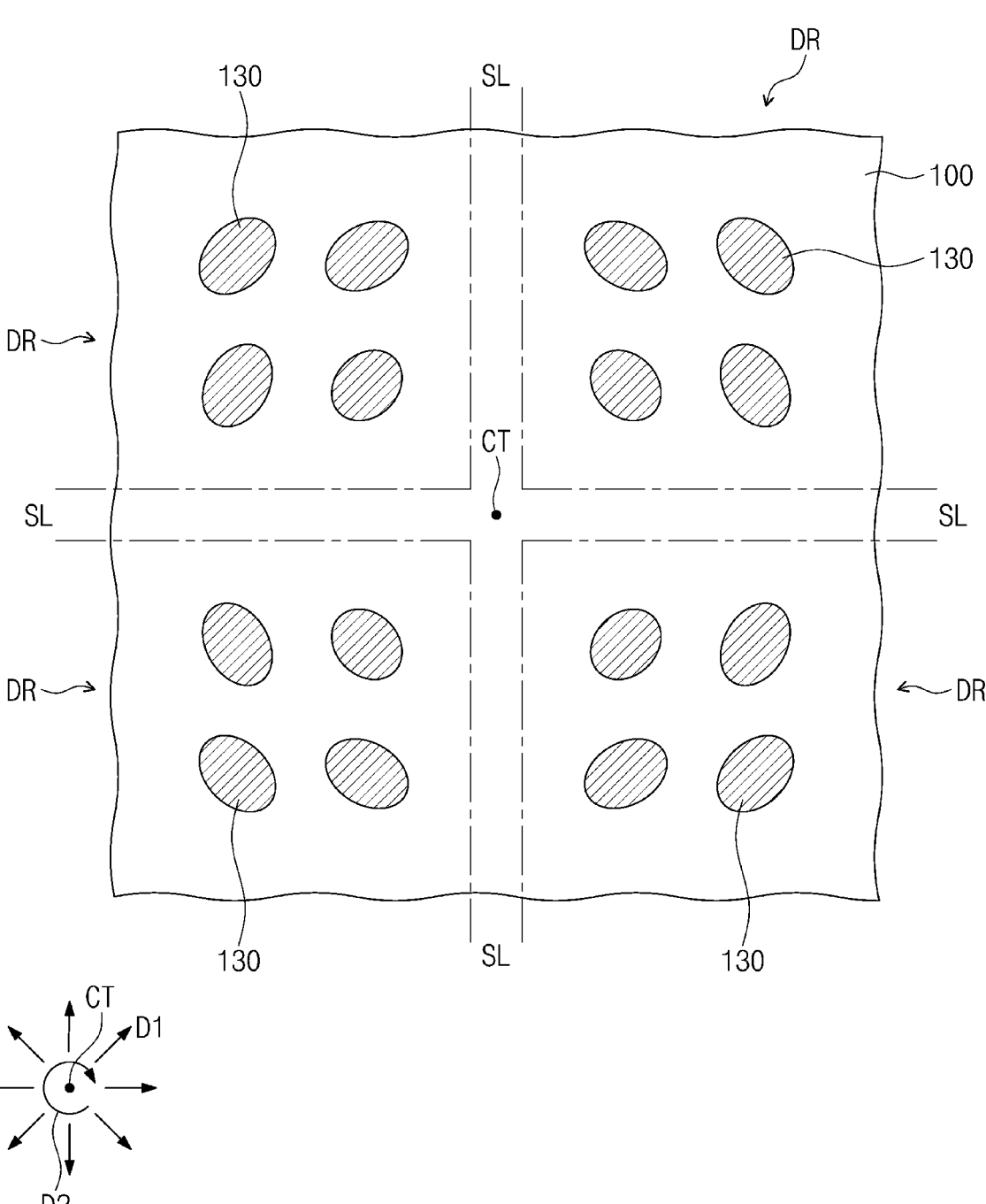
FIG. 15 illustrates a plan view showing a semiconductor package according to some embodiments of the present inventive concept.

FIG. 14 illustrates a cross-sectional view showing a semiconductor package according to some embodiments of the present inventive concept. FIG. 15 illustrates a plan view showing a semiconductor package according to some embodiments of the present inventive concept.

Referring to FIGS. 14 and 15, differently from the embodiments of FIGS. 1 to 13, a first substrate 100 may be a substrate on which a plurality of semiconductor devices are provided. For example, the first substrate 100 may have device regions DR that are divided by a sawing line SL. The sawing line SL may indicate an imaginary line or region along which a cutting process is performed on a semiconductor substrate in fabricating a semiconductor package. The device regions DR may correspond to areas on each of which one semiconductor die (or one semiconductor chip or one semiconductor package) is formed on the first substrate 100, and the semiconductor dies on the device regions DR may be divided from each other in the cutting process. For example, the first substrate 100 may be a wafer or panel for forming a plurality of semiconductor packages.

The first substrate 100 may be provided thereon with first substrate pads 110, first seed layers 112 below the first substrate pads 110, a first protection layer 120 that surrounds the first substrate pads 110 on the first substrate 100, and first bump structures 130 coupled to the first substrate pads 110 through openings OP of the first protection layer 120. The first substrate pads 110 may be provided on the device regions DR, and the first substrate pads 110 provided on one device region DR may be connected to an integrated circuit of one semiconductor die. The first bump structures 130 provided on one device region DR may be connection terminals for external connection of the one semiconductor die. The first bump structures 130 may be substantially similar to the first bump structures 130 discussed with reference to FIGS. 1 to 6. For example, when viewed in a plan view, a minor axis of each of the first bump structures 130 may be directed in the first direction D1 toward a center CT of the first substrate 100, and a major axis of each of the first bump structures 130 may be directed in the second direction D2 that rotates about the center CT of the first substrate 100. As shown in FIG. 15, the center CT of the first substrate 100 may be positioned in the sawing line SL or between the device regions DR. In this case, concentric circles formed by planar shapes of the first bump structures positioned on one semiconductor die may have a center positioned on an outer side of the semiconductor die. The major axes of the first bump structures 130 in one of the semiconductor dies may be directed in a direction different from that of the major axes of the first bump structures 130 in another of the semiconductor dies. Aspects of the present inventive concept, however, are not limited thereto. Differently from that shown in FIG. 15, the center CT of the first substrate 100 may be positioned on one of the device regions DR.

According to some embodiments of the present inventive concept, the first substrate 100 may be bonded through the first bump structures 130 to another substrate. The first bump structures 130 may have major axes that extend along (e.g., tangential to) a direction that rotates about the center CT of the first substrate 100. Therefore, even when the first substrate 100 and the another substrate are twist-shifted from each other, the first bump structures 130 may be easily coupled to the another substrate. For example, even in a case of bonding between panels or wafers having a plurality of semiconductor dies, a semiconductor package may increase in electrical connection properties and structural stability.

Figure 16:
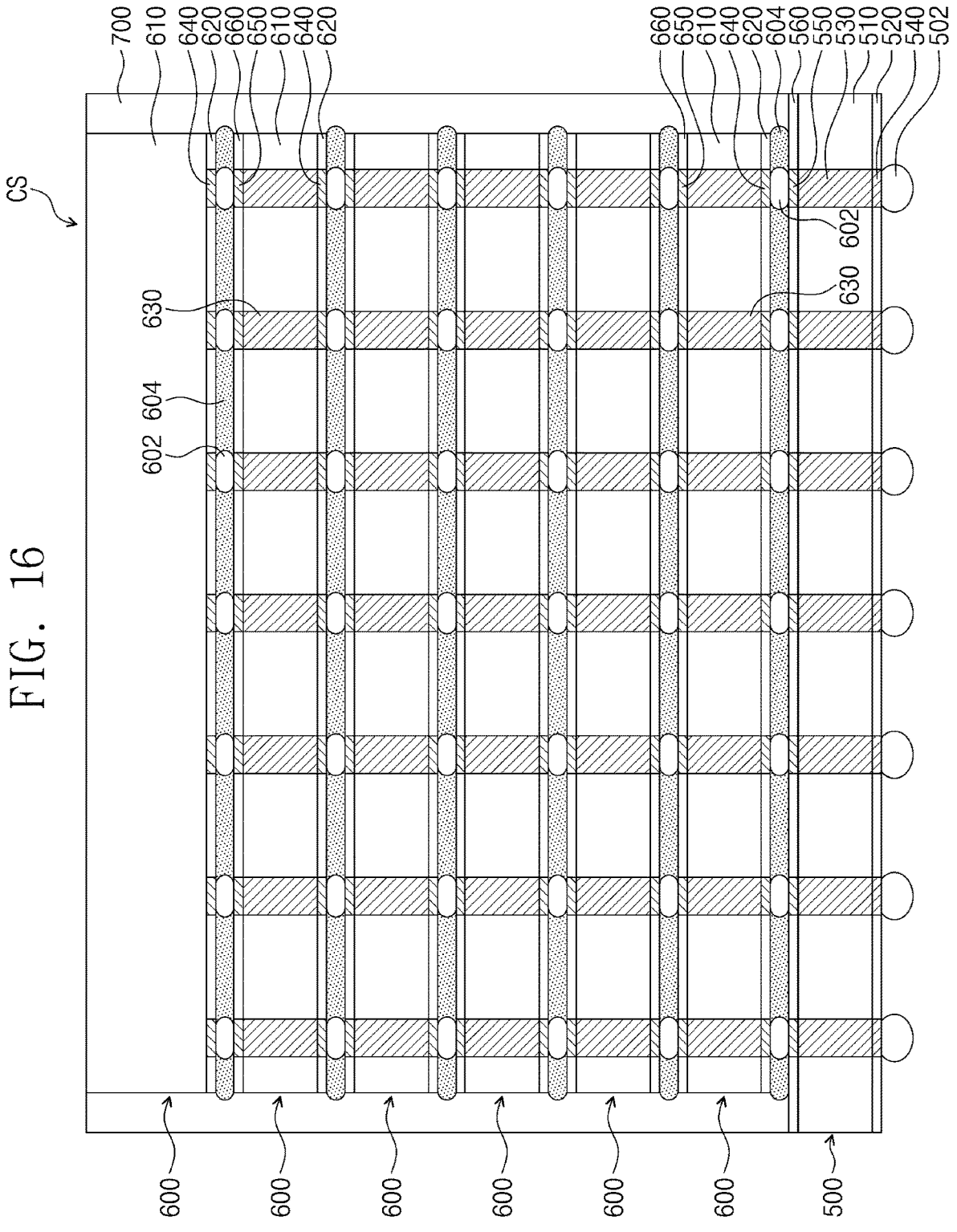
FIG. 16 illustrates a cross-sectional view showing a semiconductor package according to some embodiments of the present inventive concept.
Figure 17:
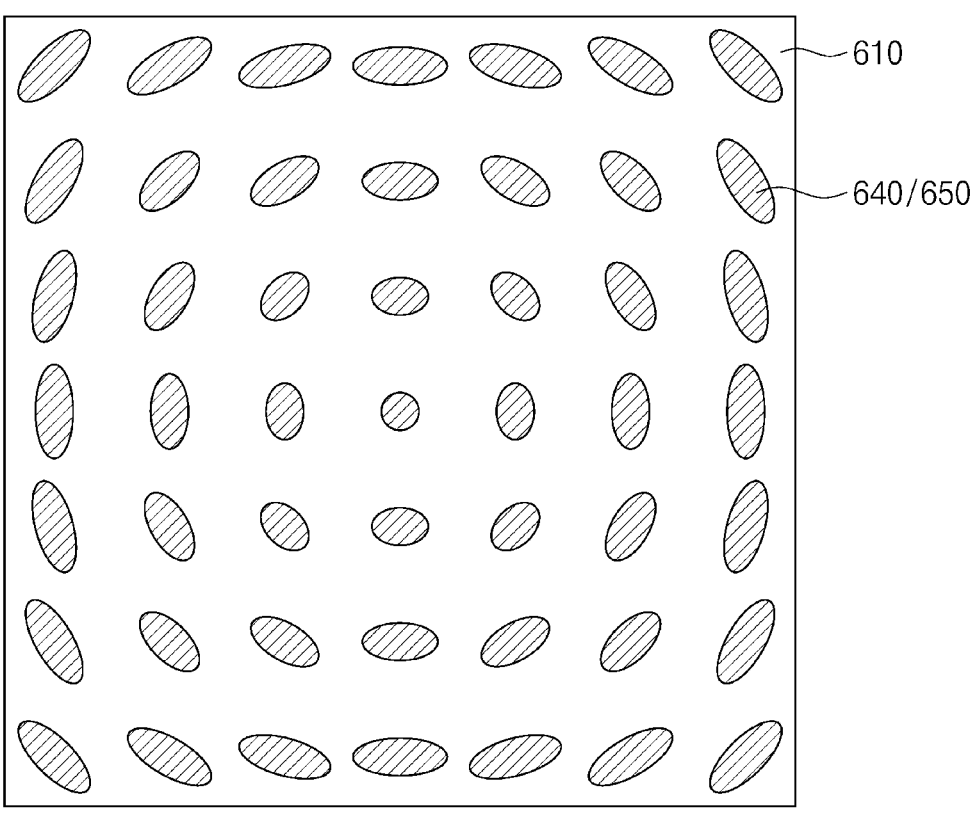
FIG. 17 illustrates a plan view showing a semiconductor package according to some embodiments of the present inventive concept.

FIG. 16 illustrates a cross-sectional view showing a semiconductor package according to some embodiments of the present inventive concept. FIG. 17 illustrates a plan view showing a semiconductor package according to some embodiments of the present inventive concept.

Referring to FIGS. 16 and 17, a semiconductor package may be a stacked package in which a via is used. For example, the same type of dies 600 may be stacked on a base substrate 500, and the dies 600 may be electrically connected to each other through second through electrodes 630 that penetrate the dies 600. The dies 600 may be coupled to each other through connection terminals 602 provided on bottom surfaces of the dies 600. For example, the dies 600 may constitute a micro-ball grid array (MBGA) or a micro-pillar grid array (MPGA).

The base substrate 500 may include an integrated circuit therein. For example, the base substrate 500 may be a die that includes an electronic element such as a transistor. For example, the base substrate 500 may be a wafer-level semiconductor die formed of a semiconductor such as silicon (Si). Aspects of the present inventive concept, however, are not limited thereto. According to some embodiments of the present inventive concept, the base substrate 500 may not include an electronic element such as a transistor. The base substrate 500 may include a first semiconductor substrate 510, first lower pads 540 provided on a bottom surface of the first semiconductor substrate 510, a first lower protection layer 520 that surrounds the first lower pads 540 on the bottom surface of the first semiconductor substrate 510, first upper pads 550 provided on a top surface of the first semiconductor substrate 510, a first upper protection layer 560 that surrounds the first upper pads 550 on the top surface of the first semiconductor substrate 510, and first through electrodes 530 that vertically penetrate the first semiconductor substrate 510 to electrically connect the first lower pads 540 to the first upper pads 550. The first semiconductor substrate 510 may be provided on its one surface with an integrated circuit such as a logic circuit.

The base substrate 500 may include external terminals 502. The external terminals 502 may be provided on the first lower pads 540 of the base substrate 500.

A chip stack CS may be disposed on the base substrate 500. The chip stack CS may include the dies 600 stacked on the base substrate 500. The following description will focus on one die 600 to explain a configuration of the dies 600.

The die 600 may include an integrated circuit therein. For example, the die 600 may be a die that includes an electronic element such as a transistor. For example, the die 600 may be a wafer-level semiconductor die formed of a semiconductor such as silicon (Si). The die 600 may include a second semiconductor substrate 610, second lower pads 640 provided on a bottom surface of the second semiconductor substrate 610, a second lower protection layer 620 that surrounds the second lower pads 640 on the bottom surface of the second semiconductor substrate 610, second upper pads 650 provided on a top surface of the second semiconductor substrate 610, a second upper protection layer 660 that surrounds the second upper pads 650 on the top surface of the second semiconductor substrate 610, and second through electrodes 630 that vertically penetrate the second semiconductor substrate 610 to electrically connect the second lower pads 640 to the second upper pads 650. The second semiconductor substrate 610 may be provided on its bottom surface with an integrated circuit such as a memory circuit.

The dies 600 may have the same configuration. However, the die 600 at top of the chip stack CS may include none of the second through electrodes 630, the second upper pads 650, and the second upper protection layer 660.

Neighboring dies 600 may be connected to each other through the connection terminals 602. For example, the second upper pads 650 and their facing second lower pads 640 may be connected to each other through the connection terminals 602. The second upper pads 650 and the second lower pads 640 may be substantially similar to the first substrate pads 110 discussed with reference to FIG. 7. For example, when viewed in a plan view as shown in FIG. 17, the second upper pads 650 and the second lower pads 640 may have minor axes that are directed in a direction toward a center of the dies 600, and may have major axes that are directed in a direction that rotates about the center of the dies 600.

According to some embodiments of the present inventive concept, the second upper pads 650 and the second lower pads 640 of the dies 600 may have major axes that extend along (e.g., tangential to) a direction that rotates about the center of the dies 600. Therefore, the dies 600 may be easily bonded even when misalignment is present between the dies 600. Accordingly, it may be possible to provide a semiconductor package with improved electrical connection properties and increased structural stability.

Referring still to FIGS. 16 and 17, underfill parts 604 may be provided between the dies 600. The underfill parts 604 may surround the connection terminals 602 while filling spaces between the dies 600.

The chip stack S may be mounted on the base substrate 500. For example, the connection terminals 602 may be provided between the second lower pads 640 of a lowermost die 600 and the first upper pads 550 of the base substrate 500, and may connect the second lower pads 640 to the first upper pads 550. The underfill part 604 may fill a space between the chip stack CS and the base substrate 500.

A molding layer 700 may be disposed on the base substrate 500. The molding layer 700 may cover a top surface of the base substrate 500. When viewed in a plan view, the molding layer 700 may surround the chip stack CS. The molding layer 700 may include a dielectric polymer material. For example, the molding layer 700 may include an epoxy molding compound (EMC).

FIGS. 18 to 29 illustrate diagrams showing a method of fabricating a semiconductor package according to some embodiments of the present inventive concept. FIGS. 18, 20, 22, 24, 26, and 28 correspond to cross sections of FIGS. 19, 21, 23, 25, 27, and 29, respectively.

Figure 18:
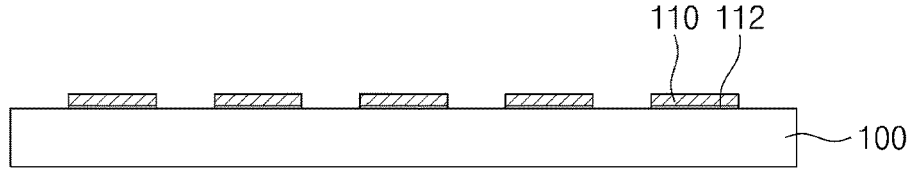
FIGS. 18 to 31 illustrate diagrams showing a method of fabricating a semiconductor package according to some embodiments of the present inventive concept.
Figure 19:
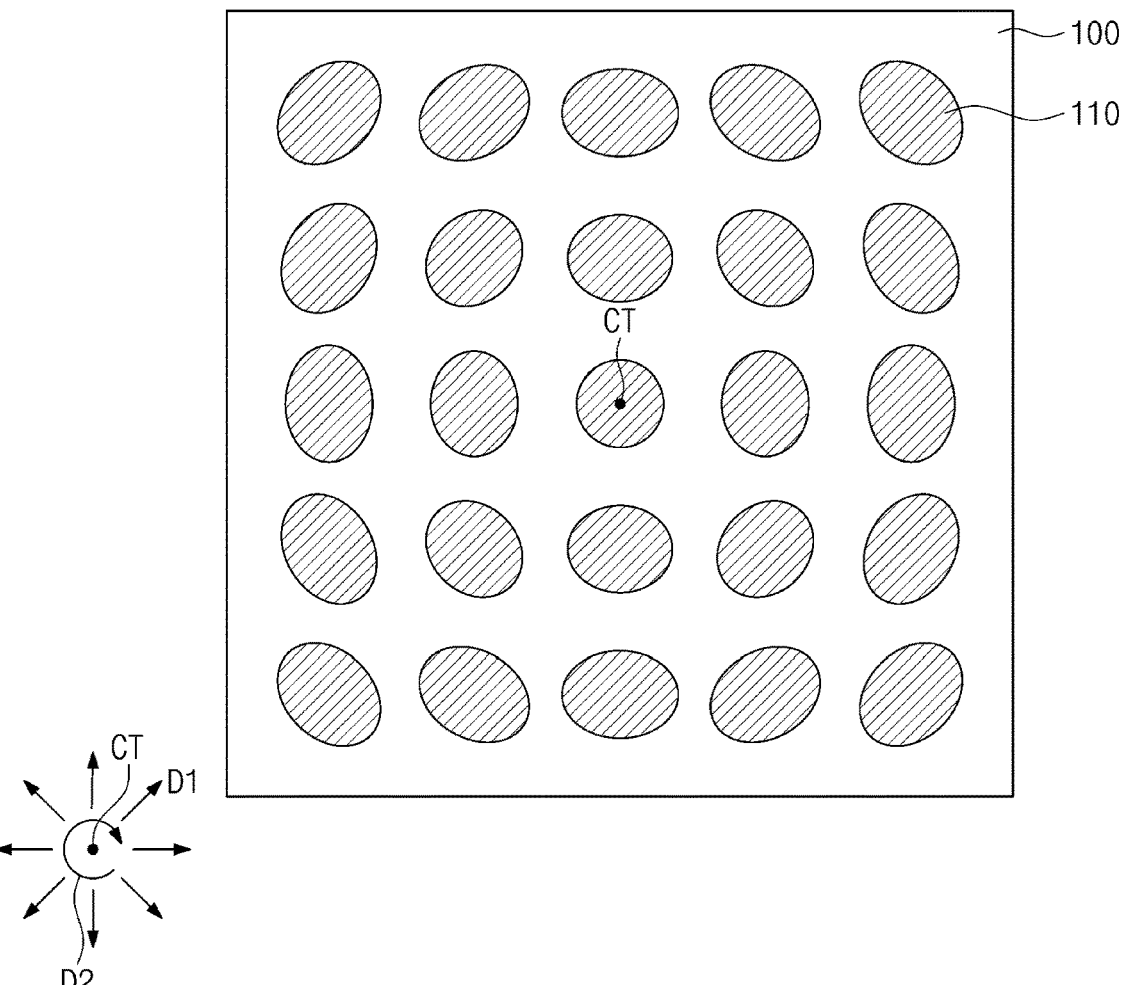

Referring to FIGS. 18 and 19, a first substrate 100 may be provided. The first substrate 100 may be a semiconductor substrate. The first substrate 100 may undergo an ordinary process to form an integrated circuit or a wiring pattern.

First substrate pads 110 may be formed on the first substrate 100. For example, a first seed layer 112 may be formed on the first substrate 100 to cover a top surface of the first substrate 100. A mask pattern may be formed on the first seed layer 112. The mask pattern may have openings that define a space in which the first substrate pads 110 are formed. When viewed in a plan view, a minor axis of each of the openings may be directed in a first direction D1 toward a center CT of the first substrate 100. A major axis of each of the openings may extend tangentially to a circle having a center disposed at the center CT of the first substrate 100. The first substrate pads 110 may be formed by performing a plating process in which a first seed layer 112 exposed by the openings is used as a seed. The mask pattern may be removed. When viewed in a plan view, in accordance with shapes of the openings, a minor axis of each of the first substrate pads 110 may be directed in the first direction D1 toward the center CT of the first substrate 100, and a major axis of each of the first substrate pads 110 may extend tangentially to a circle having a center disposed at the center CT of the first substrate 100. However, planar shapes of the first substrate pads 110 may be variously changed if necessary. Afterwards, the first substrate pads 110 may be used as an etching mask to partially remove the first seed layer 112 to form first seed layers 112.

Figure 20:
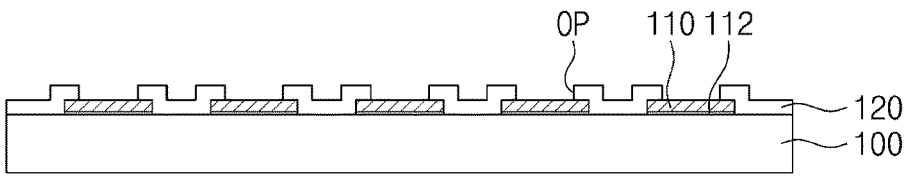
Figure 21:
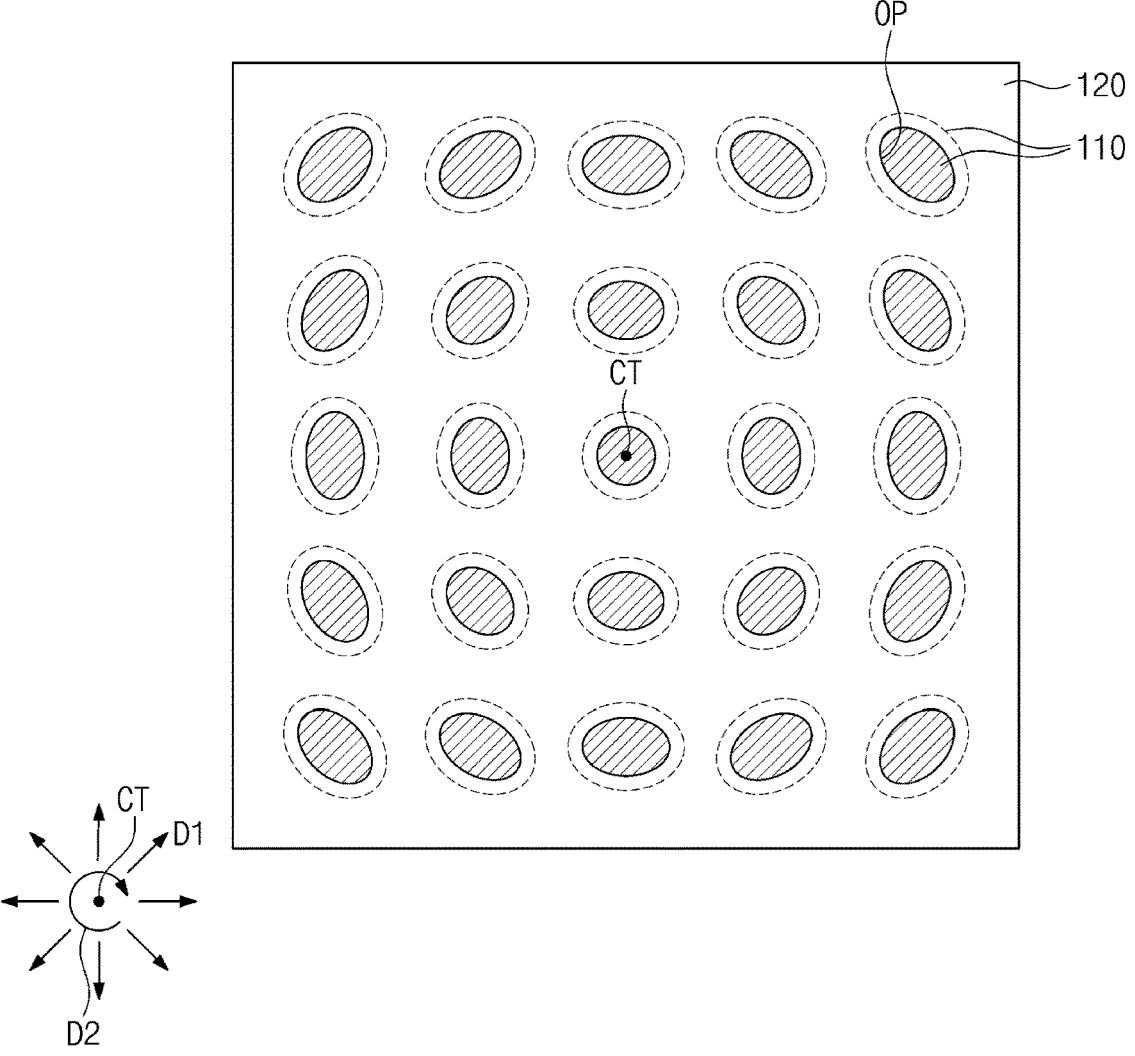

Referring to FIGS. 20 and 21, a first protection layer 120 may be formed on the first substrate 100. For example, a dielectric material may be deposited or coated on the first substrate 100 to cover the first substrate pads 110, thereby forming the first protection layer 120. The first protection layer 120 may be patterned to form openings OP that expose the first substrate pads 110.

Figure 22:
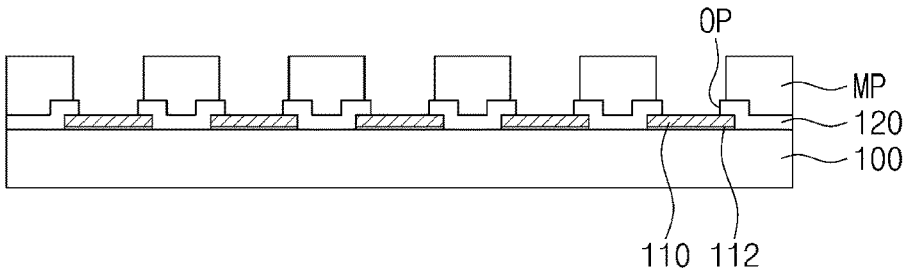
Figure 23:
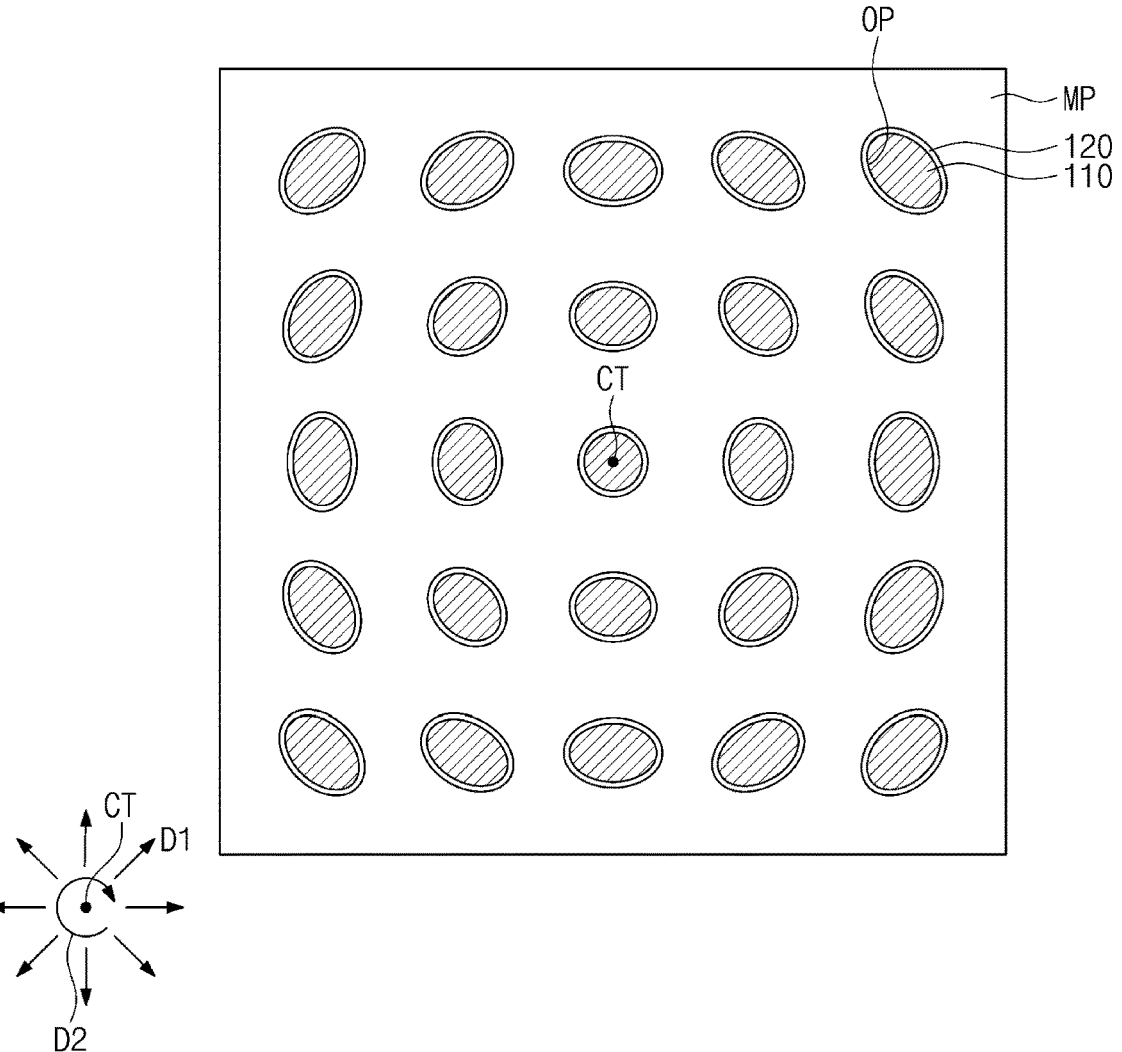

Referring to FIGS. 22 and 23, a mask pattern MP may be formed on the first substrate 100. The mask pattern MP may cover the first protection layer 120. The mask pattern MP may have pattern holes that expose the first substrate pads 110. The pattern holes may have planar shapes greater than those of the openings OP of the first protection layer 120. For example, when viewed in a plan view, the openings OP may be positioned within the pattern holes. Therefore, the first substrate pads 110 may have top surfaces exposed by the first protection layer 120, and the pattern holes of the mask pattern MP may completely expose the top surfaces of the first substrate pads 110. The pattern holes of the mask pattern MP may have planar shapes that are changed depending on position on the first substrate 100. For example, when viewed in a plan view, a minor axis of each of the pattern holes may be directed in the first direction D1 toward the center CT of the first substrate 100. A major axis of each of the pattern holes may extend tangentially to a circle having a center disposed at the center CT of the first substrate 100.

Figure 24:
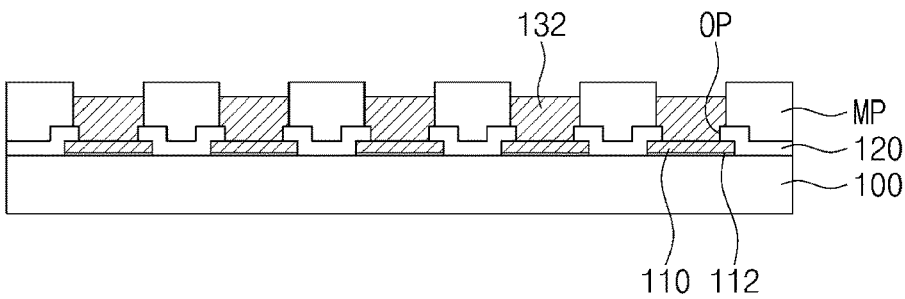
Figure 25:
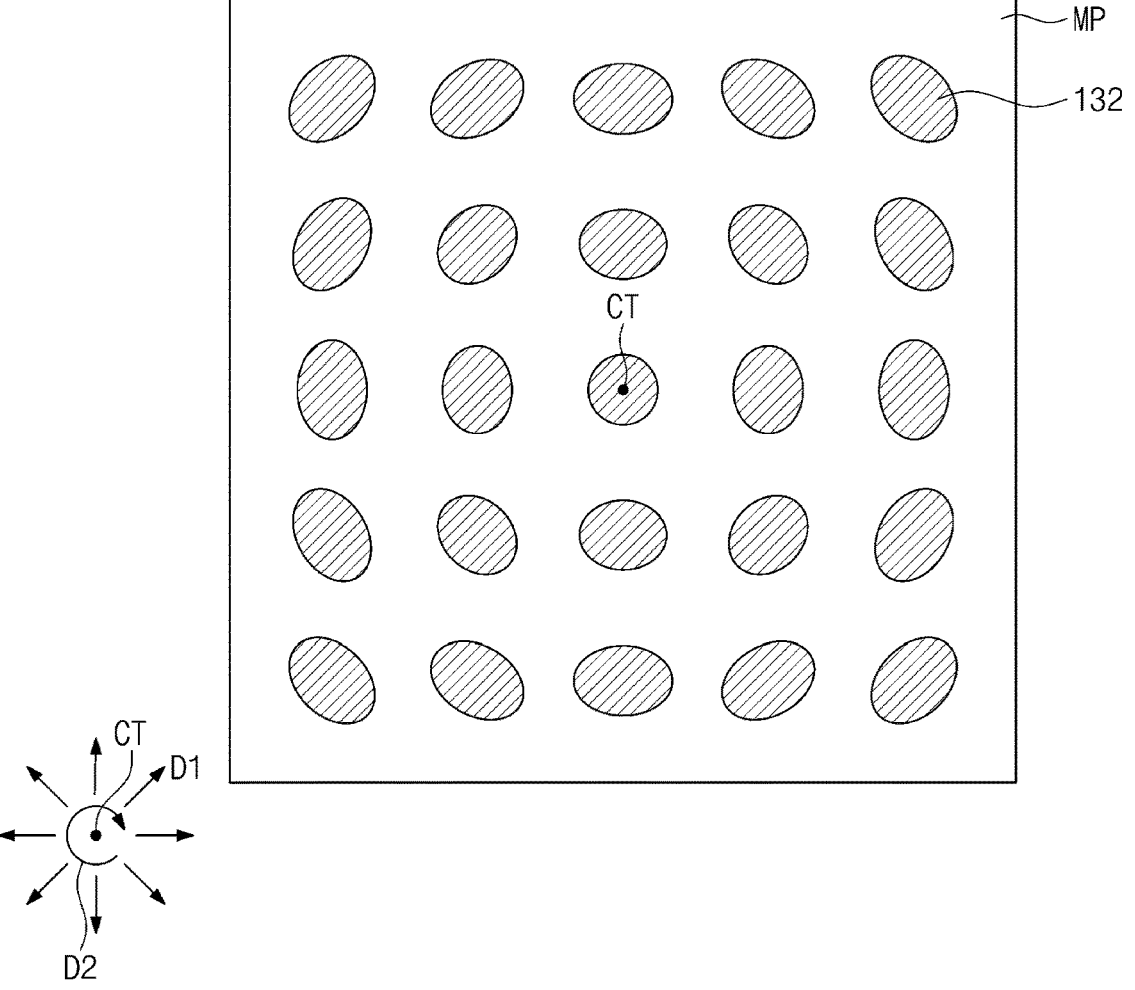

Referring to FIGS. 24 and 25, first conductive posts 132 may be formed. For example, the top surfaces of the first substrate pads 110 exposed by the mask pattern MP and the first protection layer 120 may be used as a seed to perform a plating process. The plating process may cause a metallic material to fill the pattern holes of the mask pattern MP. When viewed in a plan view, in accordance with the planar shapes of the pattern holes, a minor axis of each of the first conductive posts 132 may be directed in the first direction D1 toward the center CT of the first substrate 100, and a major axis of each of the first conductive posts 132 may extend tangentially to a circle having a center disposed at the center CT of the first substrate 100.

Figure 26:
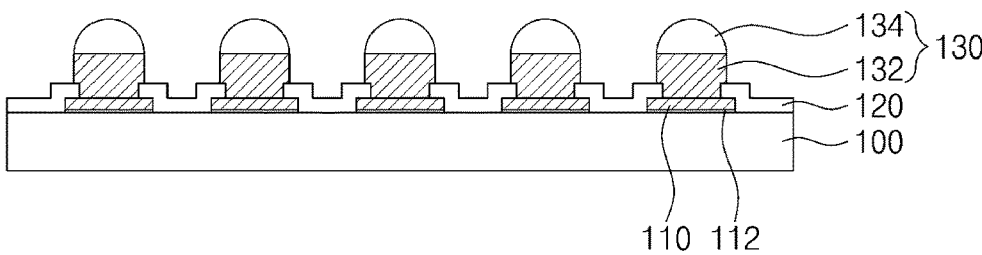
Figure 27:
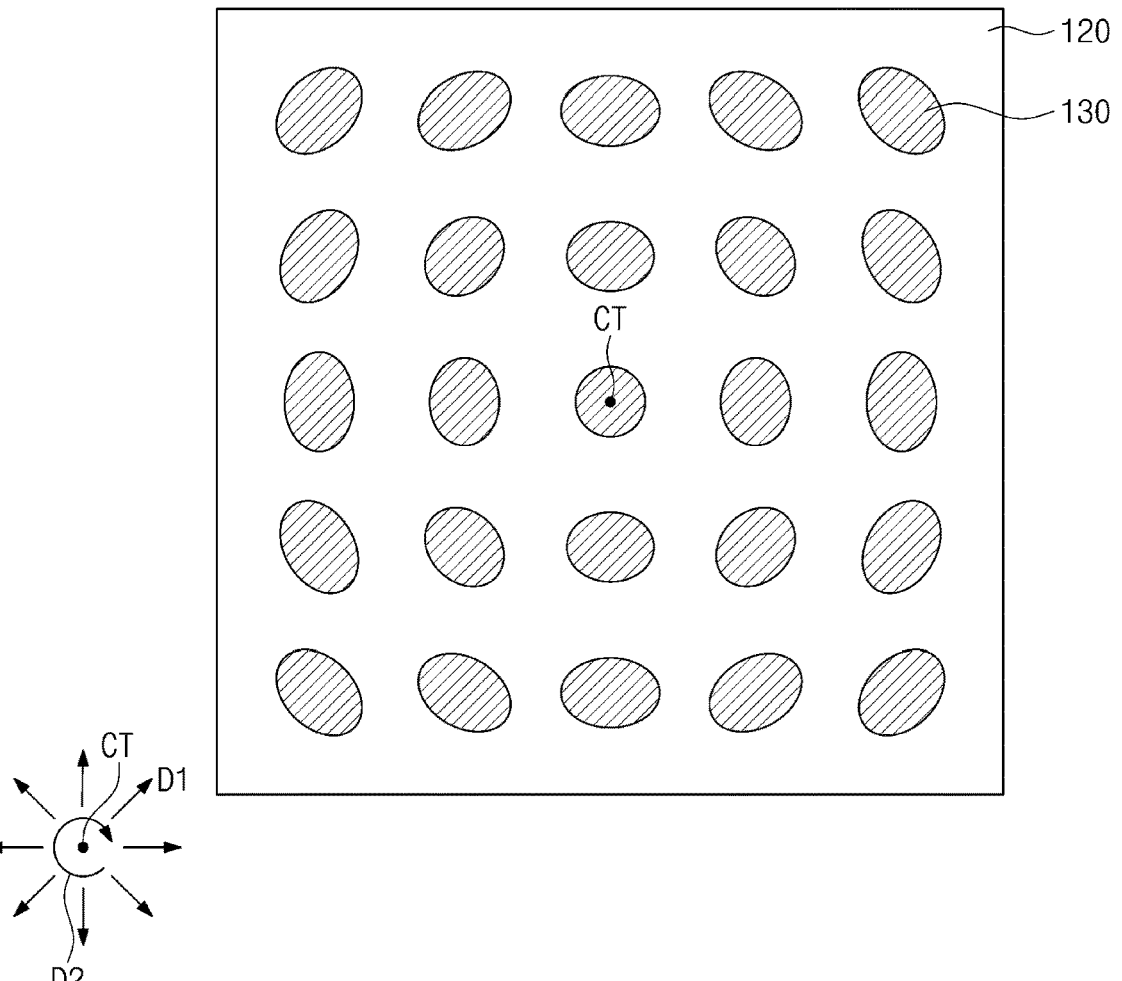

Referring to FIGS. 26 and 27, first solder bumps 134 may be formed on the first conductive posts 132. For example, in the pattern holes of the mask pattern (see MP of FIGS. 24 and 25), a solder material may be placed on the first conductive posts 132, and then the solder material may undergo a reflow process to form the first solder bumps 134 on the first conductive posts 132. The first conductive posts 132 and the first solder bumps 134 may constitute first bump structures 130. Afterwards, the mask pattern MP may be removed. According to some embodiments, the mask pattern MP may be removed, and thereafter, the first solder bumps 134 may be formed on the first conductive posts 132.

As such, it may be possible to fabricate a semiconductor package discussed with reference to FIG. 1.

Figures 28, 29:
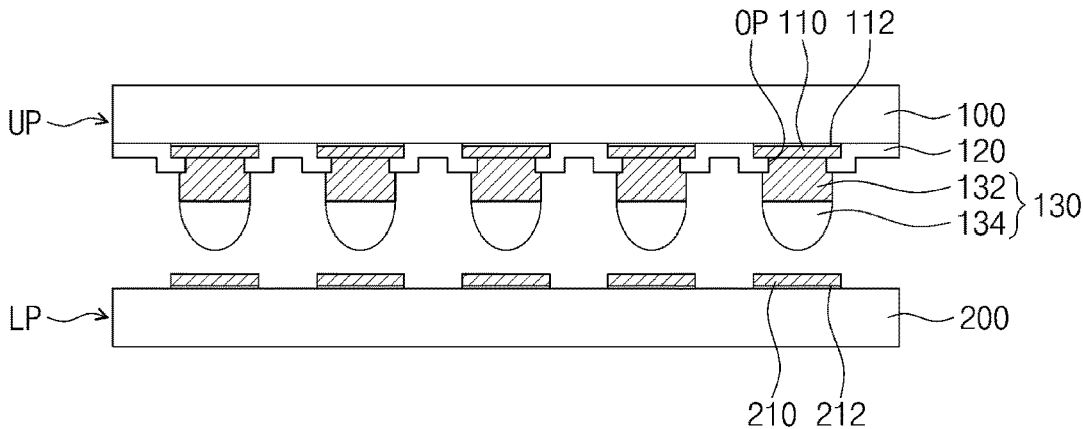

Referring to FIGS. 28 and 29, the semiconductor package fabricated by the embodiment of FIGS. 18 to 27 may be an upper package UP.

A lower package LP may be provided. The lower package LP may correspond to the lower package LP discussed with reference to FIGS. 9 and 10. For example, the lower package LP may include a second substrate 200 and second substrate pads 210 on the second substrate 200.

The upper package UP may be positioned on the lower package LP. The first bump structures 130 may be directed toward the lower package LP. For example, the lower package LP and the upper package UP may be aligned to allow the second substrate pads 210 of the lower package LP to face the first bump structures 130 of the upper package UP. In this step, the lower package LP and the upper package UP may not be completely aligned due to process distribution or mechanical errors of process equipment. For example, as shown in FIG. 29, the second substrate 200 may be disposed twist-shifted (or rotationally shifted) on the first substrate 100.

Referring back to FIGS. 9 and 10, the upper package UP may be mounted on the lower package LP. For example, the upper package UP and the lower package LP may approach each other to allow the first bump structures 130 to contact the second substrate pads 210. After that, the first solder bumps 134 of the first bump structures 130 may undergo a reflow process to bond the first solder bumps 134 to the second substrate pads 210.

According to some embodiments of the present inventive concept, the first bump structures 130 may have major axes that extend along the second direction D2 that rotates about the center CT of the first substrate 100. Therefore, although the lower package LP and the upper package UP are misaligned with each other, it may be possible to allow the first bump structures 130 to easily contact the second substrate pads 210 and to achieve a good bonding between the first bump structures 130 and the second substrate pads 210. Thus, failure such as the occurrence of poor bonding between the first bump structures 130 and the second substrate pads 210 may be reduced or prevented during a fabrication process for a semiconductor package.

Figure 30:
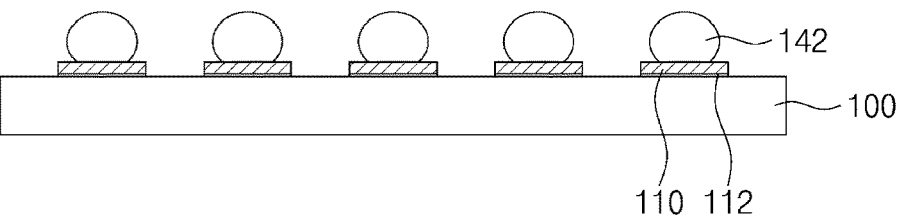
Figure 31:
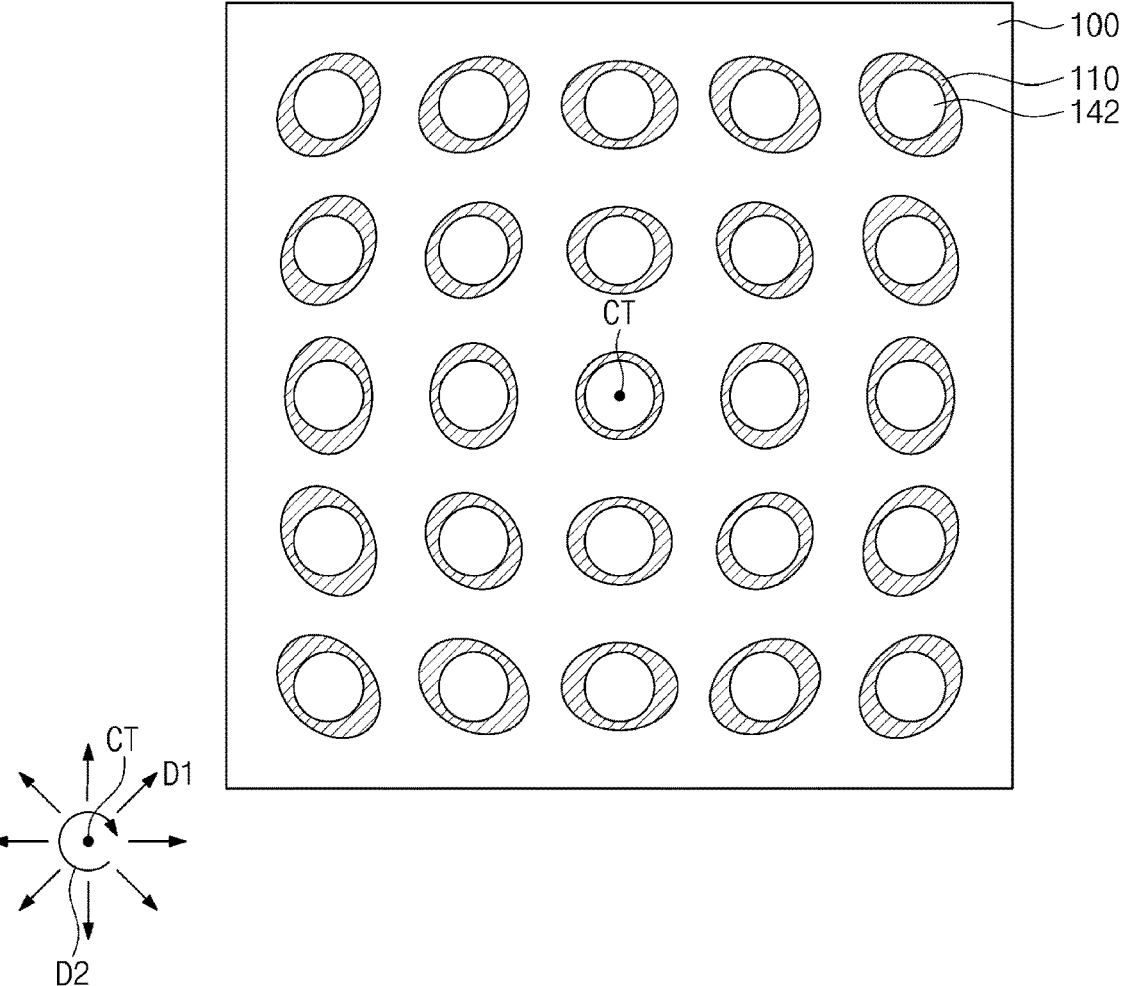

FIGS. 30 and 31 illustrate diagrams showing a method of fabricating a semiconductor package according to some embodiments of the present inventive concept. FIG. 30 corresponds to a cross section of FIG. 31.

Referring to FIGS. 30 and 31, on a resultant structure of FIGS. 18 and 19, a minor axis of each of the first substrate pads 110 may be directed in the first direction D1 toward the center CT of the first substrate 100, and a major axis of each of the first substrate pads 110 may extend tangentially to a circle having a center disposed at the center CT of the first substrate 100.

Solder materials 142 may be provided on the first substrate pads 110. The solder materials 142 may be correspondingly positioned on the first substrate pads 110.

Referring back to FIGS. 7 and 8, solders 140 may be formed on the first substrate pads 110. For example, the solder materials 142 on the first substrate pads 110 may undergo a reflow process to form the solders 140 on the first substrate pads 110. Wettability of the reflowed solder material 142 may cause the solders 140 to have planar shapes the same as or similar to those of the first substrate pads 110. For example, a minor axis of each of the solders 140 may be directed in the first direction D1 toward the center CT of the first substrate 100, and a major axis of each of the solders 140 may extend tangentially to a circle having a center disposed at center CT of the first substrate 100.

According to a semiconductor package in accordance with some embodiments of the present inventive concept, in a case where bump structures are used to electrically connect a substrate to a certain device, such as an external apparatus, a motherboard, or another substrate, even when the substrate is twist-shifted (or rotationally shifted) from the certain device, the bump structures may vertically overlap (e.g., align) with at least portions of corresponding pads, and substrates may be free of bonding failure caused by misalignment between the substrates. Accordingly, a semiconductor package may increase in electrical connection properties, structural stability, and operating stability.

In a method of fabricating a semiconductor package according to some embodiments of the present inventive concept, even when a lower package and an upper package are misaligned with each other, it may be possible to allow bump structures to easily contact substrate pads and to achieve a good bonding between the bump structures and the substrate pads. Thus, the occurrence of failure such as poor bonding between the first bump structures and the substrate pads may be reduced or prevented during a fabrication process for the semiconductor package.

Although aspects of the present inventive concept have been described in connection with some embodiments of the present inventive concept illustrated in the accompanying drawings, it will be understood by one of ordinary skill in the art that variations in form and detail may be made therein without departing from the spirit and essential feature of aspects of the present inventive concept. The above disclosed embodiments should thus be considered illustrative and not restrictive.

What is claimed is:

1. A semiconductor package, comprising:

a first substrate having a plurality of first pads on a first surface of the first substrate;

a second substrate on the first substrate, the second substrate having a plurality of second pads on a second surface of the second substrate, the second pads being positioned corresponding to the first pads; and a plurality of connection terminals between the first substrate and the second substrate, the connection terminals correspondingly coupling the first pads to the second pads, wherein each of the connection terminals has a first major axis and a first minor axis that are parallel to the first surface of the first substrate and are orthogonal to each other, wherein, when viewed in a plan view, the first minor axis of each of the connection terminals is directed toward a center of the first substrate.

2. The semiconductor package of claim 1, wherein the first minor axis of each of the connection terminals is parallel to a first direction away from the center of the first substrate, and the first major axis of each of the connection terminals extend tangentially to a circle having a center disposed at the center of the first substrate.

3. The semiconductor package of claim 1, wherein a ratio of the first major axis to the first minor axis of each of the connection terminals has a value selected from a range of about 1.2:1 to about 2.5:1.

4. The semiconductor package of claim 1, wherein an interval between neighboring connection terminals of the connection terminals has a value selected from a range of about 2 micrometers to about 8 micrometers.

5. The semiconductor package of claim 1, wherein the connection terminals have an oval planar shape, a rectangular planar shape, or a polygonal planar shape.

6. The semiconductor package of claim 1, wherein the first major axes of the connection terminals have lengths that increase with increasing distance from the center of the first substrate.

7. The semiconductor package of claim 1, wherein, when viewed in a plan view, the second substrate is twist-shifted at an angle having a value selected from about −10° to about +10° on the first substrate.

8. The semiconductor package of claim 7, wherein, among the first pads and the second pads, a pair of first and second pads that are connected to each other through one connection terminal are horizontally shifted from each other when viewed in a plan view.

9. The semiconductor package of claim 1, wherein each of the first pads has a second major axis and a second minor axis that are parallel to the first surface of the first substrate and are orthogonal to each other, wherein, when viewed in a plan view, the second minor axis of each of the first pads is directed toward the center of the first substrate.

10. The semiconductor package of claim 9, wherein the second minor axis of each of the first pads is parallel to a first direction away from the center of the first substrate, and the second major axis of each of the first pads extend tangentially to a circle having a center disposed at the center of the first substrate.

11. The semiconductor package of claim 1, further comprising:

a first protection layer on the first surface of the first substrate, the first protection layer covering the first pads; and a second protection layer on the second surface of the second substrate, the second protection layer covering the second pads, wherein the connection terminals penetrate the first protection layer to be coupled to the first pads and penetrate the second protection layer to be coupled to the second pads.

12. The semiconductor package of claim 1, wherein the first substrate is a first semiconductor substrate of a first semiconductor die, the second substrate is a second semiconductor substrate of a second semiconductor die, and the center of the first substrate is a center of the first semiconductor die.

13. The semiconductor package of claim 1, wherein the first substrate is one of a wafer and a panel on each of which a plurality of first semiconductor dies are formed, and the second substrate is one of a wafer and a panel on each of which a plurality of second semiconductor dies are formed.

14. The semiconductor package of claim 13, wherein the first major axes of the connection terminals included in one of the first semiconductor dies are directed in a direction different from a direction of the first major axes of the connection terminals included in another of the first semiconductor dies.

15. A semiconductor package, comprising:

a first substrate;

a plurality of first pads on a top surface of the first substrate;

a first protection layer on the top surface of the first substrate and covering the first pads the first protection layer has a plurality of first openings that vertically penetrate the first protection layer on the first pads and expose top surfaces of the first pads; and a plurality of first solders correspondingly in the first openings and coupled to the first pads, wherein each of the first solders has a first width in a first direction away from a center of the first substrate and a second width in a second direction that rotates about the center of the first substrate, and wherein the second width is about 1.2 times to about 2.5 times the first width.

16. The semiconductor package of claim 15, wherein each of the first solders has a first major axis and a first minor axis that are parallel to the top surface of the first substrate and are orthogonal to each other, wherein the second width is a length of the first major axis, and wherein the first width is a length of the first minor axis.

17. The semiconductor package of claim 15, wherein the first solders have an oval planar shape, a rectangular planar shape, or a polygonal planar shape.

18. The semiconductor package of claim 15, wherein the second widths of the first solders increase with increasing distance from the center of the first substrate.

19. The semiconductor package of claim 15, further comprising:

a second substrate on the first substrate; and a plurality of second pads on a bottom surface of the second substrate, wherein the first solders are coupled to the second pads.

20. A semiconductor package, comprising:

a first substrate;

a plurality of first pads on a top surface of the first substrate;

a second substrate mounted on the first substrate; and a plurality of second pads on a bottom surface of the second substrate and positioned corresponding to the first pads, wherein the first pads are correspondingly electrically connected to the second pads, and wherein each of the first pads includes:

a first minor axis in a first direction away from a central point on a plane on which the top surface of the first substrate is provided; and a first major axis in a second direction that rotates about the central point.

\*   \*   \*   \*   \*